(12) United States Patent
de Rochemont

(10) Patent No.: US 11,681,348 B2
(45) Date of Patent: Jun. 20, 2023

(54) HIGH SPEED / LOW POWER SERVER FARMS AND SERVER NETWORKS

(71) Applicant: L. Pierre de Rochemont, Austin, TX (US)

(72) Inventor: L. Pierre de Rochemont, Austin, TX (US)

(*) Notice: Subject to any disclaimer, the term of this patent is extended or adjusted under 35 U.S.C. 154(b) by 857 days.

(21) Appl. No.: 16/403,411

(22) Filed: May 3, 2019

(65) Prior Publication Data

US 2020/0033931 A1 Jan. 30, 2020

Related U.S. Application Data

(60) Provisional application No. 62/666,124, filed on May 3, 2018.

(51) Int. Cl.
*G06F 1/324* (2019.01)
*G05B 9/02* (2006.01)

(52) U.S. Cl.
CPC .............. *G06F 1/324* (2013.01); *G05B 9/02* (2013.01)

(58) Field of Classification Search
CPC .................................. G05B 9/02; G06F 1/324
See application file for complete search history.

(56) References Cited

U.S. PATENT DOCUMENTS

| | | |
|---|---|---|
| 5,264,736 A | 11/1993 | Jacobson |
| 5,633,785 A | 5/1997 | Parker et al. |
| 6,456,525 B1 | 9/2002 | Perner et al. |
| 6,606,014 B2 | 8/2003 | Miller |
| 7,411,283 B2 | 8/2008 | Hockanson et al. |
| 8,779,489 B2 * | 7/2014 | de Rochemont ... H01L 23/5222 257/296 |
| 10,504,843 B2 * | 12/2019 | de Rochemont ....... H01L 23/66 |
| 2002/0040391 A1 | 4/2002 | Chaiken et al. |
| 2002/0161074 A1 | 10/2002 | Zhang et al. |
| 2011/0147723 A1 | 6/2011 | John, Jr. et al. |
| 2014/0013129 A1 | 1/2014 | De Rochemont et al. |
| 2014/0013132 A1 | 1/2014 | De Rochemont |
| 2015/0256484 A1 | 9/2015 | Cameron |
| 2018/0224916 A1 * | 8/2018 | de Rochemont ....... G06F 13/42 |
| 2018/0308636 A1 | 10/2018 | De Rochemont |
| 2018/0358295 A1 | 12/2018 | De Rochemont |

FOREIGN PATENT DOCUMENTS

| | | |
|---|---|---|
| JP | 6285865 B2 | 2/2018 |
| RU | 2412483 C2 | 2/2011 |
| WO | WO-2019190550 A1 * | 10/2019 |

OTHER PUBLICATIONS

International Preliminary Report on Patentability in PCT application No. PCT/US2019/030747 dated Nov. 3, 2020.
International Search Report and Written Opinion in PCT application No. PCT/US2019/030747 dated Nov. 7, 2019.
International Search Report and Written Opinion in PCT application No. PCT/US2019/35633 dated Dec. 12, 2019.

* cited by examiner

*Primary Examiner* — Chun Cao
(74) *Attorney, Agent, or Firm* — Burns & Levinson LLP; Jerry Cohen

(57) ABSTRACT

A server farm has servers with at least one hybrid computing module operating at a system clock speed that optimally matches the intrinsic clock speed of a semiconductor die embedded within a high speed semiconductor chip stack or mounted upon the semiconductor carrier.

4 Claims, 22 Drawing Sheets

PERSPECTIVE VIEW
(Front and Top)

HIGH SPEED / LOW POWER SERVER FARMS AND SERVER NETWORKS

CROSS-REFERENCE TO RELATED APPLICATIONS

The present application claims priority to U.S. Provisional Patent Application No. 62/666,124, filed May 3, 2018 and incorporated herein in its entirety.

FIELD OF THE INVENTION

The present invention generally relates to the design and construction of a server farm comprising high computational speeds and higher power efficiency within a smaller physical footprint, wherein higher computational speeds, smaller physical footprints, and greater power efficiencies are generated by displacing printed circuit boards from the microelectronic assemblies.

The present invention additional relates to power management stages that introduce power savings within a server farm or network of server farms.

The present invention generally relates to the design and construction of and a regional or global network of server farms that are linked together with high-speed/high power efficiency optical, wireless, and satellite telecommunications systems.

The present invention specifically relates to server farms comprising hybrid computing modules, further comprising high-speed semiconductor chip stacks.

The present invention specifically relates to server farm networks further comprising high-speed semiconductor chip stacks.

The present invention includes a solid state gyrator formed as a single part that is used as a lossless component of a power management stage in a server farm or is used for higher speed modulation systems within a regional or global network of server farms.

The present invention additionally relates to the use of power management stages comprising resonant gate transistors and high voltage drop inductor or transformer that transform, invert, or convert electrical energy drawn from a power source to AC or DC voltage used by an electronic system to be managed by a single stage power management stage or no more than two power management stages.

1. Background to the Invention

Server farms consume Mega-Watts of electrical power that strain the power grid and drive up electrical costs to the community. Without substantial government subsidies the digital economy has not demonstrated a real capacity to realize the strong profits. Estimates for the amount of power annually consumed to mine Bitcoin and other crypto-currencies range from 15-32 Vera-Watts, costing miners 30%-60% of their annual revenues. These costs will only increase as the complexity of mining algorithms grows exponentially. The continued growth of the digital economy will require adding additional capacity to the power grid. The most economically efficient solution will reduce the power consumption of server farms/data centers so the additional capacity does not strain domestic power grids.

It is therefore desirable to introduce means by which a regional or global network of servers, wherein each server form has a dramatically smaller physical footprint and cuts its power consumption at least 100-fold, thus introducing a cost structure that ensures a vibrant and profitable digital economy thrives without government subsidies that impoverishes the general public.

2. Overview of the Related Art de Rochemont U.S. Pat. No. 7,405,698 entitled "CERAMIC ANTENNA MODULE AND METHODS OF MANUFACTURE THEREOF" (the '698 application) discloses the use of high permittivity electroceramic to form transmission lines that have characteristic impedance that matches the input/output impedance of a semiconductor chip, and the integration of those transmission lines on the surface of a semiconductor die or electrical interconnect (interposer), but it does not disclose art related to transmission lines that comprise high permittivity and high relative permeability dielectrics configured along the path of a transmission line that causes the transmission line to resonate a given frequency or desired clock speed, nor does it disclose the incorporation of passive circuits within transmission lines in close proximity to a via within a chip stack or the application of those devices within a server farm.

de Rochemont U.S. Pat. No. 8,715,839, filed Jun. 30, 2006, entitled "ELECTRICAL COMPONENT AND METHOD OF MANUFACTURE" (the '839 application) discloses and claims high permittivity electroceramics that by virtue of having uniform nanoscale grain size and microstructure exhibits dielectric permittivity that remains stable over standard operating temperatures. It also discloses the incorporation of those high permittivity electroceramics within a capacitor that is formed on the surface of a semiconductor die, an electrical interconnect (interposer), or within a printed circuit board, but it does not disclose its application to semiconductor chip stacks or the application of those devices within a server form.

3. Definition of Terms

The term "average amu" is herein understood to mean the median atomic mass of a unit cell for a crystalline compound derived by summing the fractional atomic mass units contributed by elements forming the crystal lattice.

The acronym "BEOL" is herein understood to be an abbreviation for Back End of Line and understood to mean fabrication processes that are among the last group of processes performed in the final assembly of a semiconductor chip.

The term "Bitcoin" is herein understood to mean a digital crypto-currency that is mined on a Blockchain using a computer algorithm and exists in limited supply.

The term "Blockchain" is herein understood to mean a process used to form a trusted auditable record in a digital ledger that is distributed across a computer network.

The terms "chemical complexity", "compositional complexity", "chemically complex", or "compositionally complexity" are herein understood to refer to a material, such as a metal or superalloy, compound semiconductor, or ceramic that consists of three (3) or more elements from the periodic table.

The term "chip stack" is herein understood to mean a bonded three dimensional (3D) assembly of chips that may comprise semiconductor die and non-semiconductor chip elements, such as sensors, micro-electromechanical systems ("MEMS"), and/or interposer circuits that provide passive electrical interconnections between the various components in the 3D assembly.

The term "critical performance tolerances" is herein understood to refer to the ability for all passive components in an electrical circuit to hold performance values within ±1% of the desired values at all operating temperatures over which the circuit was designed to function.

The term "distributed ledger technology" is herein understood to refer to a computational platform that generates a trusted database distributed across a computer network wherein trust related to an entry or transaction is assured when a majority of computers that are parties to the network confirm the entry or transaction and said entry or transaction remains a permanent record of the computer network that can be openly inspected and cannot be altered.

The term "electroceramic" is herein understood to refer to its conventional meaning as being a complex ceramic material that has robust dielectric properties that augment the field densities of applied electrical or magnetic stimulus.

The term "integrated circuit" (or "IC") is herein understood to mean a semiconductor chip into which a large, very large, or ultra-large number of transistor elements have been embedded.

The term "liquid chemical deposition" (or "LCD") is herein understood to mean a method that uses liquid precursor solutions to fabricate materials of arbitrary compositional or chemical complexity as an amorphous laminate or free-standing body or as a crystalline laminate or free-standing body that have atomic-scale chemical uniformity and a microstructure that is controllable down to nanoscale dimensions.

The term "MAX-phase material" is herein understood to define a chemically complex intermetallic ceramic material having the general chemical formula $M_{(n+1)}AX_n$, wherein M is first row transition-metal element, A is an "A-group" element found in columns III-VI of the periodic table, and X is either carbon (C) or nitrogen (N).

The term "microstructure" is herein understood to hold its traditional meaning of relating to the grain size, grain chemistry, and grain boundary chemistry of a polycrystalline ceramic material.

The acronym "PCB" is herein understood to reference a printed circuit board.

The term "passive component" is herein understood to refer to its conventional definition as an element of an electrical circuit that that modulates the phase or amplitude of an electrical signal without producing power gain.

The term "physical layer" is herein understood to understood to mean a patterned or unpatterned material layer embedded within a microelectronic circuit wherein the material possesses some unique physical property that enhances the proper function of the circuit or a circuit element.

The term "resonant gate transistor" is herein understood to refer to any of the transistor architectures disclosed in de Rochemont, U.S. Ser. No. 13/216,192, "POWER FET WITH A RESONANT TRANSISTOR GATE", wherein the transistor switching speed is not limited by the capacitance of the transistor gate, but operates at frequencies that cause the gate capacitance to resonate with inductive elements embedded within the gate structure.

The term "server farm" is herein understood to mean a large collection of servers that functions as a data center, internet or telecommunications switching center, or digital commerce platform used for high frequency trading, cryptocurrency mining or exchange, a backbone for digital banking, or a platform for eCommerce.

The term "standard operating temperatures" is herein understood to mean the range of temperatures between −40° C. and +125° C.

The term "surface feature" is herein understood to mean one or more patterned physical layers integrated on the surface of a substrate wherein the patterns and physical properties of die physical layers are designed to serve some functional purpose within a microelectronic circuit.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The term "thermomechanical" is herein understood to refer to its conventional definition as relating to properties induced or created by the simultaneous application of elevated temperature and mechanical force or pressure.

The term "thinned" is herein understood to refer to an interposer, a sensor chip, or a semiconductor die that has been ground and chemical mechanically polished to reduce its original thickness to a lesser thickness, preferably a thickness on the order of 25 µm or less.

The term "thru via" or "via" is herein understood to refer to its conventional definition as relating to a vertical electrical connection that is made by filling a thru hole with an electrically conductive substance.

The terms "tight tolerance" or "critical tolerance" are herein understood to mean a performance value, such as a capacitance, inductance, or resistance that varies less than ±1% over standard operating temperatures.

The term "transmission line" is herein understood, for the specific purpose of this application, to refer to any of the following: a microstrip 352, a stripline 354, ground-cladded stripline 357, ground-cladded dielectric waveguide 355, and a dielectric slab waveguide 359

The term "II-VI compound semiconductor" is herein understood to refer to its conventional meaning describing a compound semiconductor comprising at least one element from column IIB of the periodic table including: zinc (Zn), cadmium (Cd), or mercury (Hg); and, at least one element from column VI of the periodic table consisting of: oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table including: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table including: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table including: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

One embodiment of the present invention provides a server farm comprising a server, wherein the server or servers comprise: at least one hybrid computing module operating at a system clock speed that optimally matches the intrinsic clock speed of a semiconductor die embedded within a high speed semiconductor chip stack or mounted upon the semiconductor carrier; and one or more high-speed semiconductor chip stacks bonded to the surface of a semiconductor carrier in which at least one passive component element, preferably all passive components elements maintain critical performance tolerances, and have a polarization response time determined solely by orbital deformations and operates in phase, thus does not distort, any of the applied signal components forming a high-speed digital pulse operating at clock speeds up to and into the terahertz (THz) frequency domain.

The hybrid computing module within a server or plurality of servers may comprise a power management device that further comprises a resonant gate transistor. The hybrid computing module may be configured for Minimal Instruction Set Computing by means of a chip that comprises a FORTH engine mounted on a semiconductor carrier or embedded within a high speed chip stack. The servers may be mounted within a plurality of slots in 3 server rack, further comprising a harness that forms a communications bus interface, preferably an optical interface, with other servers mounted within the server rack. The server racks may be assembled to form a server tower comprising a plurality of server racks and a harness that forms a communications bus interface, preferably an optical interface, with other servers mourned within the server tower. The server farm may have a plurality of towers used to form at least one row of server towers or a plurality of rows of server towers and a harness that forms a communications bus interface, preferably an optical interface, with other server towers distributed within a row of server towers or between rows of server towers. The servers may be mounted within a plurality of slots in a server rack, further comprising a harness that forms a communications bus interface, preferably an optical interface, with other servers mounted within the server rack. The server racks may be assembled to form a server tower comprising a plurality of server racks and a harness forms a communications bus interface, preferably an optical interface, with other servers mounted within the server tower. The server farm may have a plurality of towers used to form at least one row of server towers or a plurality of rows of server towers and a harness that forms a communications bus interface, preferably an optical interface, with other server towers distributed within a row of server towers or between rows of server towers. The servers may be mounted within a plurality of slots in a server rack, further comprising a harness that forms a communications bus interface, preferably an optical interface, with other servers mounted within the server rack. The server racks may be assembled to form a server tower comprising a plurality of server racks and a harness forms a communications bus interface, preferably an optical interface, with other servers mounted within the server tower. The server farm may have a plurality of towers used to form at least one row of server lowers or a plurality of rows of server towers and a harness that forms a communications bus interface, preferably an optical interface, with other server lowers distributed within a row of server towers or between rows of server towers. The hybrid computing module configured for Minimal Instruction Set Computing may utilize a computing language other than FORTH, but the processor chip that enables the engine to adopt a Stack Machine Architecture has features similar to a FORTH engine including: the ability to access multiple memory spaces simultaneously in a single microprocessor clock cycle; and, that utilizes a minimal number of instruction sets through the use of separate buses to access memory holding the data stack, the return stack, and the program memory, among other useful program utilities. The server farm may have no need for cache memory or predictive algorithms. The server farm may process a function using the most efficient algorithm type (iterative, recursive, or deeply nested loop) for that specific function. The hybrid computing module may not have a predictive algorithm to manage the sequence of data or instructions sets flowing into a processor chip. The servers may be mounted within a plurality of slots in a server rack, further comprising a harness that forms a communications bus interface, preferably an optical interface, with other servers mounted within the server rack. The server racks may be assembled to form a server tower comprising a plurality of server racks and a harness forms a communications bus interface, preferably an optical interface, with other servers mounted within the server tower. The server racks may be assembled to form a server tower comprising a plurality of server racks and a harness forms a communications bus interface, preferably an optical interface, with other servers mounted within the server tower. The server farm may have a plurality of towers used to form at least one row of server towers or a plurality of rows of server towers and a harness that forms a communications bus interface, preferably an optical interface, with other server towers distributed within a row of server towers or between rows of server towers. The servers may be mounted within a plurality of slots in a server rack, further comprising a harness that forms a communications bus interface, preferably an optical interface, with other servers mounted within the server rack. The server racks may be assembled to form a server tower comprising a plurality of server racks and a harness forms a communications bus interface, preferably an optical interface, with other servers mounted within the server tower. The server racks may be assembled to form a server tower comprising a plurality of server racks and a harness forms a communications bus interface, preferably an optical interface, with other servers mounted within the saver tower. The server farm may have a plurality of towers used to form at least one row of server towers or a plurality of rows of server towers and a harness that forms a communications bus interface, preferably an optical interface, with other server towers distributed within a row of server towers or between rows of server towers. The server may not include a printed circuit board.

Another embodiment of the present invention provides a server having a hybrid computing module comprising: at least one hybrid computing module operating at a system clock speed that optimally matches the intrinsic clock speed of a semiconductor die embedded within a high speed semiconductor chip stack or a semiconductor die mounted upon a semiconductor carrier, wherein at least one semiconductor embedded within the high-speed semiconductor chip stack or semiconductor die mounted upon the semiconductor carrier is a resistive element X-Point (Cross-Point) memory device.

The hybrid computer module may further comprise, one or more high-speed semiconductor chip stacks bonded to the surface of a semiconductor carrier in which at least one passive circuit element, preferably all passive circuit elements, consists of electroceramic dielectric members that maintain critical performance tolerances. The passive circuit may comprise electroceramic dielectric members having a polarization response time determined solely by orbital deformations within and operates in phase, thus does not distort, any of the applied signal components forming a high-speed digital pulse operating at clock speeds up to and into the terahertz THz) frequency domain. The electroceramic dielectric members may have high dielectric density producing a relative permittivity ($\varepsilon_R$) in excess of $\varepsilon_R$=40, preferably in excess of $\varepsilon_R$=200. The electroceramic dielectric members may have high dielectric density producing a relative permeability ($\mu_R$) in excess of $\mu_R$=10, preferably in excess of $\mu_R$=100. A hybrid computing module or high speed semiconductor chip stack may be in electrical communication with a power management device that further comprises a resonant gate transistor used as a power switch. The power management device may be formed or mounted on the semiconductor carrier. The power management device may be mounted within the harness of a server rack. A power management device, preferably a power management device comprising a resonant gate transistor, may convert the read voltage from a resistive memory element located at a single address location on a X-Point (Cross Point) memory system or device into a bit pulse. A power management device, preferably a power management device comprising a resonant gate transistor, may simultaneously convert a plurality of read voltages from a plurality or string of resistive memory element address locations within a X-Point (Cross Point) memory system of device into a string of pulsed bits or a bit string. The string of pulsed bits, or bit string, may be produced simultaneously during a single processor clock cycle. A bit string may be interpreted as a word or a plurality of words. The words or plurality of words may be simultaneously input or output to the processor during a single clock cycle through a plurality of independent and simultaneously operating bus interfaces managing data traffic between memory systems/devices and processor(s), wherein the simultaneous bus interfaces include, but are not limited to: one or more data stack buses, one or more return stack buses, one or more register buses, and one or more program memory buses. A single resistive memory element may be used to store a plurality of addressable memory states from a single memory address, and the single resistive element state is used to store a data byte or a word. A power management device, preferably a power management device comprising a resonant gate transistor, may convert the read voltage from a resistive memory element located at a single address location on a X-Point (Cross Point) memory system or device into a bit string that faithfully represents the data byte or word. A power management device, preferably a power management device comprising a resonant gate transistor, may simultaneously convert a plurality of read voltages from a plurality of resistive memory element address locations, each capable of storing a plurality of addressable memory states from a single address location within a X-Point (Cross Point) memory system or device into a plurality of data bytes or words. The data bytes or words may be simultaneously produced in a single processor clock cycle.

Yet another embodiment of the present invention provides power management system that delivers electrical power from the power grid or a primary electrical source to a server farm or other facility that consumes electrical power comprises three high efficiency power management stages, preferably only requires two high efficiency power management stages, between the power grid or primary power source and any internal AC or DC power bus in the server farm or any other facility that consumes electrical power.

The power management system may have a power efficiency of 90% that reduces system losses to 10%, and preferably has a power efficiency of 95% that reduces system losses to 5%, when delivering power from the power grid or from a primary power source any internal AC or DC power bus in the server farm or any other facility that consumes electrical power. The power management system may have power efficiencies greater than or equal to 98%. The power management system may have AC power comprising a hollow waveguide structure. The high efficiency power management stages may comprise one or more high efficiency power modules. The one or more power management modules may filler spurious signals generated by Dirty Electricity from AC voltages propagating within the server farm or other facility that consumes electrical power. The one or more power management modules may comprise a resonant gate transistor. The one or more power management modules may comprise a fully integrated gyrator. The one or more power management modules may comprise a fully integrated gyrator further comprising a resonant gate transistor. The one or more power management modules may comprise an inductor coil or transformer coils, preferably a toroidal inductor coil or transformer coils. The inductor coil or transformer coils may further comprise magnetic core materials. The magnetic core materials may comprise high energy density dielectric electroceramic dielectric members. The power management system may have at least one inductor coil or transformer coils comprising magnetic core materials is used for an energy storage inductor coil or within a flyback transformer. The magnetic core materials may comprise optimal energy storage locations. The inductor coil or transformer coil windings may comprise high hardness constraining members. The high hardness constraining members comprise low-CTE ceramic may have a coefficient of expansion of 0.5 ppm/° C. The high hardness constraining members may comprise MAX-Phase carbide ceramic or a layered combination of low-CTE ceramic and MAX-Phase carbide ceramic. The inductor coil or transformer coils may comprise enveloping amorphous silica dielectric located between the windings of an inductor coil or transformer coils. The amorphous silica dielectric located between the windings may have sufficient thickness to insulate the inductor coil and transformer coils from arc discharges when the applied differential voltage drops between windings that exceed 600 VAC, 1 KVAC, 50 KVAC or 250 KVAC.

The high efficiency power management stage may comprises an input power block that may further comprise: one or more power control systems that regulates the flow of electrical power from the power grid or a primary electrical source by means of current sensors and a current limiter that electrically isolate one or more power management modules within the power management system, a low loss transformer stage, and one or more high efficiency power management modules that interface AC power input from the power grid or a primary electrical power source to an AC or DC power bus internal to the server farm or other facility that consumes electrical power. The power control system may comprise a resonant gate transistor. The power control system may comprise a fully integrated gyrator. The fully integrated gyrator may comprise a resonant gate transistor. The current limiter may synchronously operate with a resonant gate transistor interfaced with a ladder circuit that rapidly monitors changes to input currents being feed into power management modules to detect power spikes or pulse edges that are characteristic of a power surge that will likely damage high efficiency power management modules or equipment within the server farm or other facility that consumes electrical power, and then uses a resonant gate transistor within the current limiter to shut the power surge to ground. The resonant gate transistor may be interfaced with a ladder circuit, wherein the resonant gate transistor switches power in excess of resonant gate transistors within the power management modules. The resonant gate transistor may be interfaced with a ladder circuit and may preferably switch at speeds greater than or equal to 10× the switching speeds of resonant gate transistors within the power management modules. The power management system may comprises a fully integrated gyrator. The low-loss transformer stage may comprise a fully integrated gyrator. The one or more high efficiency power management modules may form a thermal interface with a thermoelectric device, preferably a thermoelectric device comprising a 3D Quantum gas. The power input block may form a thermal interface with a thermoelectric device, preferably a thermoelectric device comprise a 3D Quantum gas.

The one or more high efficiency power management modules may be AC-DC inverters when supplying DC parallel output currents to the internal power bus. The one or more high efficiency power management modules may be AC-AC transformers that filter dirty electricity from the AC parallel output currents feeding the internal power bus. The power bus may electrically interface with an energy storage facility. The energy storage facility may comprise a battery, a flywheel, a resonant high energy storage device, or other means to store electrical energy.

A power management system that delivers electrical power from a primary DC electrical source, or an AC power line on the power grid that serves a secondary customer, to a server farm or other facility that consumes electrical power wherein, the power management system and only requires two (2) high efficiency power management stages, preferably only requires one (1) high efficiency power management stages, between the power grid or primary power source and any internal AC or DC power bus in the server farm or any other facility that consumes electrical power. The power management system may have a power efficiency of 95% that reduces system losses to 5%, and may preferably have a power efficiency of 98% that reduces system losses to 2%, when delivering power from the power grid or a primary DC electrical source or an AC power line on the power grid that serves a secondary customer to any internal AC or DC power bus in the server farm or any other facility that consumes electrical power. The power management stages have power efficiencies greater than or equal to 98%. The AC power may comprise a hollow waveguide structure.

The high efficiency power management stages may comprise one or more high efficiency power modules. The one or more power management modules may filter spurious signals generated by Dirty Electricity from AC voltages propagating within the server farm or other facility that consumes electrical power. The one or more power management modules may comprise a resonant gate transistor. The one or more power management modules may comprise a fully integrated gyrator.

The one or more power management modules may comprise a fully integrated gyrator further comprising a resonant gate transistor. The one or more power management modules may comprise an inductor coil or transformer coils, preferably a toroidal inductor coil or transformer coils. The inductor coil or transformer coils may further comprise magnetic core materials. The magnetic core materials may comprise high energy density dielectric electroceramic dielectric members. The magnetic core materials may comprise optimal energy storage locations. The power management system wherein at least one inductor coil or transformer coils may comprise magnetic core materials used within an energy storage inductor coil or within flyback transformer coils. The inductor coil or transformer coil windings may comprise high hardness constraining members. The high hardness constraining members comprise low-CTE ceramic having a coefficient of expansion of 0.5 ppm/° C.

The high hardness constraining comprise MAX-Phase carbide ceramic or a layered combination of low-CTE ceramic and MAX-Phase carbide ceramic. The inductor coil or transformer coils may comprise enveloping amorphous silica dielectric located between the windings of an inductor coil or transformer coils. The amorphous silica dielectric located between the windings may sufficient thickness to insulate the inductor coil and transformer coils from are discharges when the applied differential voltage drops between windings that exceed 600 VAC, 1 KVAC, 50 KVAC or 250 KVAC.

The power management system, wherein, a power management stage may comprises one or more power control systems that regulates the flow of DC electrical power a primary electrical source or AC power from a power line serving secondary customers for the power grid by means of current sensors and a current limiter that electrically isolate one or more power management modules within the power management system, and may further comprises one or more high efficiency power management modules that interface AC power input from the power grid or DC power from a primary electrical power source to a plurality of parallel AC or DC currents to an equal plurality of AC or DC internal power buses within the server farm or other facility that consumes electrical power. The power control system may comprise a resonant gate transistor. The power control system may comprise a fully integrated gyrator. The fully integrated gyrator may comprise a resonant gate transistor. The current limiter may synchronously operate with a resonant gate transistor interfaced with a ladder circuit that rapidly monitors changes to input currents being feed into power management modules to detect power spikes or pulse edges that are characteristic of a power surge that will likely damage high efficiency power management modules or equipment within the server farm or other facility that consumes electrical power, and then uses a resonant gate transistor within the current limiter to shut the power surge to ground. The resonant gate transistor may be interfaced with a ladder circuit of claim 115, wherein the resonant gate transistor switches power in excess of resonant gate transistors within the power management modules. The resonant gate transistor interfaced with a ladder circuit may preferably switch at speeds greater than or equal to 10× the switching speeds of resonant gate transistors within the power management modules. The one or more high efficiency power management module may comprise a fully integrated gyrator. The one or more high efficiency power management modules may form a thermal interface with a thermoelectric device, preferably a thermoelectric device comprise a 3D Quantum gas. The one or more high efficiency power management modules may be AC-DC inverters when the power management system is supplied with AC power from the power grid and the one or more high efficiency power management modules may supply one or more DC parallel output currents to the internal power buses. The one or more high efficiency power management modules may be DC-DC converters when the power management system is supplied with DC power from the primary electrical source and the one or more high efficiency power management modules supply one or more DC parallel output currents to one or more DC parallel output currents to the internal power buses. The one or more high efficiency power management modules may comprise AC-AC low loss transformers when the power management system is supplied with AC power from the power grid and the one or more high efficiency power management modules supply one or more AC parallel output currents to one or more internal AC power buses. The one or more high efficiency power management modules may supply AC parallel output currents to a single internal AC power bus and additional low-loss transformers may step up or step down AC voltages on a plurality of internal AC power buses.

The low-loss transformers may comprise a fully integrated gyrator. The one or more high efficiency power management modules may comprise low-loss AC-AC transformers that filter dirty electricity from the AC parallel output currents feeding an internal power bus.

Still another embodiment of the present invention provides an inductor coil or transformer coils that form low loss inductors and low loss transformers comprise magnetic core materials that have maximal permeability and minimal magnetic core losses by further comprising high energy density electroceramic members that: minimize Eddy current losses by consisting of any one or all of the flowing atomic elements: nickel (Ni), cobalt (Co), zinc (Zn), copper (Cu) titanium (Ti), or chromium (Cr); minimize hysteresis losses by additionally consisting of any one or all of the following atomic elements, lead (Pb), strontium (Sr) and magnesium (Mg); minimize residual magnetic loss by additionally having a microstructure with a uniform grain size distribution not greater than 7 μm, preferably a uniform grain size distribution in the range of 5-7 μm; and further minimize Eddy current losses by embedding one or more thin amorphous silica layers having thickness ≤1 μm.

The magnetic core materials, wherein high energy density electroceramic members may have electrical resistivity $\geq 10^5$ Ω-cm, preferably $\geq 10^7$ Ω-cm. The inductor coil or transformer coils may have higher energies and higher magnetic field strengths created by introducing dielectric discontinuities by include non-magnetic media within the magnetic core materials to create "air gaps" that allow higher currents to energize the inductor coil or transformer coils before the onset of magnetic saturation. The non-magnetic media may comprise amorphous silica. The inductor coil transformer coils may form a closed magnetic path by means of toroidal geometries that reduce parasitic noise generated by fringing fields and Eddy current losses generated by electromagnetic interactions between magnetic fringing fields leaking out of the magnetic core material and currents in the coil windings. The inductor coil or transformer coils may have a layer of non-magnetic material inserted between a coil winding and a high energy density electroceramic member within the magnetic core materials to minimize fringing fields penetrating into conductive elements of a winding. The inductor coil or transformer coils, wherein the high energy density electroceramic members may have relative permeability $\mu_R \geq 20$, preferably $\mu_R \geq 400$. The inductor coil or transformer coils, wherein dielectric discontinuities may be placed at optimal energy storage locations within the magnetic core material to optimize performance as an energy storing inductor coil or a flyback transformer. The inductor coil or transformer coils, wherein the optimal energy storage location within the magnetic core material of a flyback transformer may be beneath one or more secondary coil windings and the optimal energy storage location within the magnetic core material of an energy storing inductor may be beneath one or more the coil winding. The energy storing inductor or flyback transformer coil, wherein dielectric discontinuities within optimal energy storage locations may comprise a continuous volume of ultra-low loss amorphous silica dielectric or a collection of small volume distributed amorphous silica dielectric members. The optimal energy storage locations may optimally comprise a patterned three dimensional array of dielectric discontinuities that generates a stable distribution of localized micro-volumes of extreme magnetic flux densities that induce maximal inductive coupling within the adjacent windings as the energy storing inductor coil or flyback transformer is reverse cycled, wherein physical spacing between said of micro-volumes of extreme magnetic flux density may range between 1/10, 000th to 1/10th the volume of the magnetic core material located beneath the secondary coil winding. The energy storing inductor or flyback transformer coil, wherein the maximal volume of the patterned three dimensional array of dielectric discontinuities within optimal energy storage locations may comprise 1.2× the width of winding above the optimal energy storage location multiplied by the cross-sectional area of the magnetic core material around which the winding is wrapped. The energy storing inductor or flyback transformer coil, wherein the minimal volume of the patterned three dimensional array of dielectric discontinuities within optimal energy storage locations may comprise the width or less than the width of the of winding above the optimal energy storage location multiplied by the cross-sectional area of the magnetic core material around winch the winding is wrapped. The inductor coil or transformer coils, wherein coil windings may be encapsulated with enveloping amorphous silica dielectric to enable the inductor coil or transformer coils to sustain very large differential voltage drops. The inductor coil or transformer coils, wherein high hardness constraining members may be located at the center of a coil winding and the high hardness constraining members may be enveloped by low resistivity conducting elements having resistivity less than $10^{-5}$ Ω-cm, preferably with resistivity less than $10^{-7}$ Ω-cm.

The inductor coil or transformer coils, wherein the constraining members may comprise low-CTE ceramic having a coefficient of 0.5 ppm/° C. The constraining members may additionally comprise MAX-Phase ceramic in layered combination with the low-CTE ceramic. The inductor coil or transformer coils may comprise toroidal geometry that forms a magnetic current having a closed path to minimize spurious noise. The inductor coil or transformer coils, wherein proximity losses and flux jumping losses may be reduced by maintaining consistent spacing between coil windings. The transformer coils, wherein interleaved primary and secondary coil windings may be used to effectuate turn ratios. The transformer coils, wherein interleaved primary and secondary coil windings may include one or more parallel groupings of windings formed through parallel connection to ring conductor that electrical connects the parallel groupings in series, while the windings of the other transformer coil is electrically connected in series.

Even another embodiment of the present invention provides a magnetic core material that stores magnetic energy and reduces magnetic saturation, wherein the magnetic core material comprises dielectric discontinuities embedded within high energy density electroceramic members that:

minimize Eddy current losses by consisting of any one or all of the flowing atomic elements: nickel (Ni), cobalt (Co), zinc (Zn), copper (Cu) titanium (Ti), or chromium (Cr); minimize hysteresis losses by additionally consisting of any one or all of the following atomic elements: lead (Pb), strontium (Sr) and magnesium (Mg); and minimize residual magnetic loss by additionally having a microstructure with a uniform grain size distribution not greater than 7 μm, preferably a uniform grain size distribution in the range of 5-7 μm.

The dielectric discontinuities may comprise amorphous silica dielectric. The magnetic core materials may have high energy density electroceramic members have electrical resistivity $\geq 10^5$ Ω-cm, preferably $\geq 10^7$ Ω-cm. The magnetic core material may minimize Eddy current losses by embedding one or more thin amorphous silica layers having thickness ≤1 μm within the magnetic core material. The high energy density electroceramic members may have relative permeability $\mu_R \geq 20$, preferably $\mu_R 400$. The magnetic core material may have dielectric discontinuities placed at optimal energy storage locations within the magnetic core material to optimize performance as a magnetic energy storage medium within a magnetic circuit. The dielectric discontinuities within optimal energy storage locations may comprise a continuous volume of ultra-low less amorphous silica dielectric. The dielectric discontinuities within optimal energy storage locations may comprise a collection of micro-volumes of amorphous silica dielectric discontinuities rather than a continuous volume. The collection of micro-volume dielectric discontinuities may optimally comprise a patterned three dimensional array of micro-volume dielectric discontinuities that generate a stable distribution of localized micro-volumes of extreme magnetic flux densities that induce maximal inductive coupling with conductive elements of the magnetic circuit when it is reverse cycled. The magnetic circuit may be flyback transformer coils and the optimal energy storage locations within the magnetic core material of a flyback transformer may be beneath one or more secondary coil windings. The magnetic circuit may be an energy storing inductor coil and the optimal energy storage locations within the magnetic core material may be beneath one or more the coil windings.

A further embodiment of the present invention provides a fully integrated gyrator that comprises a high speed stack of semiconductor devices wherein one of the stacked semiconductor devices comprises transistor elements needed to form an operational amplifier and at least one of those transistor elements further is a resonant gate transistor.

The transistor elements may be resonant gate transistors. The semiconductor devices may be diced chips. The semiconductor devices may comprise semiconductor wafers. The fully integrated gyrator may have an operational amplifier formed by forming a bonded electrical interface through an internal major surface with a semiconductor interposer device that comprises all of the passive circuit elements needed to form a complete operational amplifier circuit using the two stacked semiconductor devices as a bonded stacked pair. The semiconductor interposer device may comprise all of the passive circuit elements needed to form a complete gyrator circuit comprising the two stacked semiconductor devices. The passive circuit elements may comprise high energy density electroceramic members that operate to critical performance tolerances. The high, energy density electroceramic members may possess a microstructure that has uniform gram chemistry and grain size that restricts dielectric polarization to orbital deformations having femto-second response times.

The circuit input may be on an external major surface of one semiconductor device and the circuit output is on the external major surface of the paired semiconductor interposer device. The fully integrated gyrator may operate as a loss-less transformer. A fully integrated gyrator may invert a network filter embedded within the semiconductor interposer device. A high speed stack of semiconductor devices may comprise a plurality of coupled bonded-pair devices wherein at least one bonded pair in the stack is a fully integrated gyrator. A high speed stack of semiconductor devices may have a plurality of fully integrated gyrators bonded into the high speed stack of semiconductor devices in series with the output of one flowing to the input of the other to form a cascading circuit. The cascading circuit may be a low loss transformer. The cascading circuit may operate in tandem to form a complex circuit comprising at least gyrator as a low-loss inductor transformer and one or more gyrators a filter or a network filter. The fully integrated gyrator may have passive circuit elements integrated within the semiconductor interposer device and positioned at or in close proximity to a via connection to the paired semiconductor device forming the gyrator. The folly integrated gyrator may have a resonant gate transistor that comprises a high resistivity transistor element, imparting resistance between greater than 1 KΩ, preferably greater than 1MΩ, between the gate and source electrodes. The rally integrated gyrator may have a resonant gate transistor that comprises a plurality passive element integrated within the gate electrode to induce resonance over a wide frequency hand or at particular frequency bands that optimize gain-bandwidth of the resonant gate transistor that improves the function of the fully integrated gyrator. The fully integrated gyrator may functions as a lossless transformer. The lossless transformer may be assembled within a cascading stack of fully integrated gyrators. The lossless transformer may be assembled as a parallel array of cascading stack of rally integrated gyrators.

An even further embodiment of a present invention provides a regional and global network of server farms and telecommunications modes, consisting of microelectronic hardware functioning as routing, data processing, and relays at telecommunications nodes throughout the network that further comprise, a high-speed semiconductor chip slack, hybrid computing modules, or both, circuits wherein capacitive passive circuit elements exclusively comprise electroceramic dielectric members having nanoscale microfracture and femto-second polarization response times, resonant gate transistors, and, high efficiency power management systems managing digital traffic over optical, satellite and wireless telecommunications networks.

The hybrid computing modules may function as a FORTH engine. The high efficiency power management systems may comprise lossless transformers. The lossless transformer may comprise a fully integrated gyrator. The telecommunications node may further comprise a $V_{DD}$ Modulator comprising a resonant gate transistor. The regional and global network may have telecommunications modes comprising optical, wireless, and satellite modes.

BRIEF DESCRIPTION OF THE DRAWINGS

The present invention is illustratively shown and described in reference to the accompanying drawings, in which.

DESCRIPTION OF THE PREFERRED EMBODIMENT

Figure 1A:
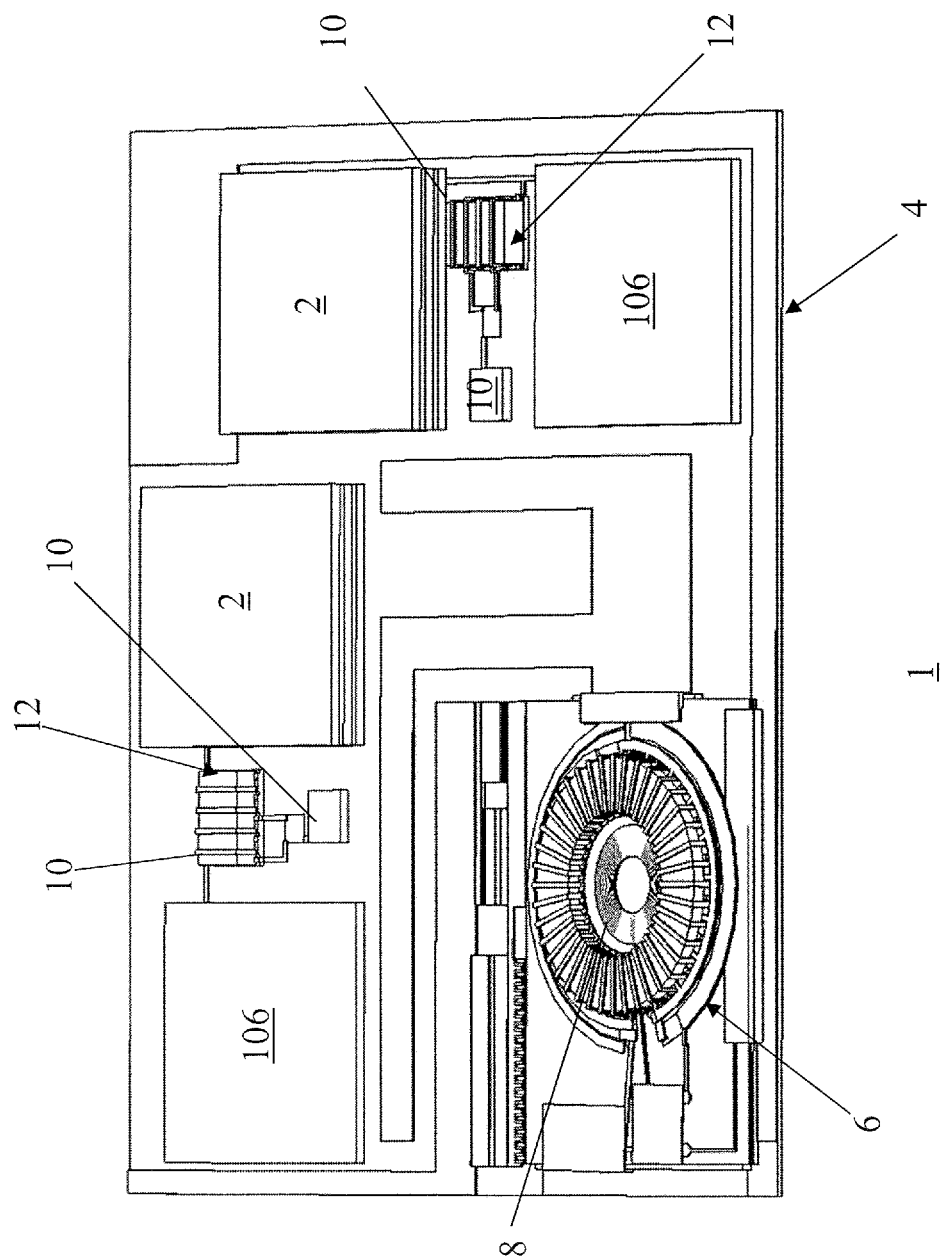
FIGS. 1A,1B depict a high speed semiconductor chip stack and a high speed semiconductor chip stack mounted on a hybrid computing module.

The present invention is illustratively described above in reference to the disclosed embodiments. Various modifications and changes may be made to the disclosed embodiments by persons skilled in the art without departing from the scope of the present invention as defined in the appended claims.

This application incorporates by reference all matter contained in de Rochemont U.S. Pat. No. 7,405,698 entitled "CERAMIC ANTENNA MODULE AND METHODS OF MANUFACTURE THEREOF" (the '698 application), de Rochemont U.S. Pat. No. 8,715,839 filed Jun. 30, 2006, entitled "ELECTRICAL COMPONENT AND METHOD OF MANUFACTURE" (the '839 application), de Rochemont U.S. Pat. No. 8,350,657 (the '657 application), filed Jan. 6, 2007 entitled "POWER MANAGEMENT MODULE AND METHODS OF MANUFACTURE", de Rochemont U.S. Ser. No. 14/560,935, (the '935 application), filed Dec. 4, 2014 entitled "POWER MANAGEMENT MODULE AND METHODS OF MANUFACTURE", de Rochemont, U.S. Ser. No. 13/216,192, "POWER FET WITH A RESONANT TRANSISTOR GATE (the '192 application), de Rochemont and Kovacs, U.S. Pat. No. 8,715,814, "LIQUID CHEMICAL DEPOSITION PROCESS APPARATUS AND EMBODIMENTS", (the '814 application) and U.S. Pat. No. 8,354,294 (the '294 application), de Rochemont, "MONOLITHIC DC/DC POWER MANAGEMENT MODULE WITH SURFACE FET", U.S. Pat. No. 8,552,708 (the '708 application), de Rochemont, U.S. Pat. No. 8,749,054 "SEMICONDUCTOR CARRIER WITH VERTICAL POWER FET MODULE", (the '054 application), de Rochemont U.S. Pat. No. 9,023,493, "CHEMICALLY COMPLEX ABLATIVE MAX-PHASE MATERIAL AND METHOD OF MANUFACTURE", (the '493 application), de Rochemont U.S. Pat. Nos. 8,779,489 and 9,153,532, "POWER FET WITH A RESONANT TRANSISTOR GATE", (the '489 and '532 application), de Rochemont U.S. Pat. No. 9,123,768, "SEMICONDUCTOR CHIP CARRIERS WITH MONOLITHICALLY INTEGRATED QUANTUM DOT DEVICES AND METHOD OF MANUFACTURE THEREOF", (the '768 application), de Rochemont U.S. Pat. No. 8,952,858, "FREQUENCY-SELECTIVE DIPOLE ANTENNAS", (the '858 application), de Rochemont and Kovacs U.S. Pat. No. 9,348,385, "HYBRID COMPUTING MODULE" (the '385 application), de Rochemont, "FULLY INTEGRATED THERMO-ELECTRIC DEVICES AND THEIR APPLICATION TO AEROSPACE DE-ICING SYSTEMS", U.S. Application No. 61/529,302 ('302), and, de Rochemont, "HIGH SPEED SEMICONDUCTOR CHIP STACK", U.S. Ser. No. 15/969,234 (the '234 application).

The '698 application instructs on methods and embodiments that provide meta-material dielectrics, including artificial magnetic ground planes, that have dielectric inclusion(s) with performance values that remain stable as a function of operating temperature. This is achieved by controlling the dielectric inclusion(s)' microstructure to nanoscale dimensions less than or equal to 50 nm. de Rochemont '839 instructs the integration of passive components that hold performance values that remain stable with temperature in printed circuit boards, semiconductor chip packages, wafer-scale SoC die, and power management systems. de Rochemont '159 instructs on how LCD is applied to form passive filtering networks and quarter wave transformers in radio frequency or wireless applications that are integrated into a printed circuit board, ceramic package, or semiconductor component, de Rochemont '657 instructs methods to form an adaptive inductor coil that can be integrated into a printed circuit board, ceramic package, or semiconductor device. de Rochemont et al. '814 discloses the liquid chemical deposition (LCD) process and apparatus used to produce macroscopically large compositionally complex materials, that consist of a theoretically dense network of polycrystalline microstructures comprising uniformly distributed grains with maximum dimensions less than 50 nm. Complex materials are defined to include semiconductors, metals or super alloys, and metal oxide ceramics, de Rochemont '814 and '708 instruct on methods and embodiments related to a fully integrated low EMI, high power density inductor coil and/or high power density power management module. de Rochemont '489 and '532 instruct on methods to integrate a field effect transistor that switch arbitrarily large currents at arbitrarily high speeds with minimal On-resistance into a rally integrated silicon chip carrier. de Rochemont '768 instructs methods and embodiments to integrated semiconductor layers that produce a 3-dimensional electron gas within semiconductor chip carriers and monolithically integrated microelectronic modules. de Rochemont '302 instructs methods and embodiments to optimize thermoelectric device performance by integrating chemically complex semiconductor material having nanoscale microstructure. de Rochemont '858 instructs means to form a circuit resonant element by folding arms of dipole antenna or transmission line to induce inductive and capacitive loads through current vector coupling. de Rochemont '234 instructs means to embed one or more passive circuit elements within or in close proximity to a via on an interposer chip or an active semiconductor chip, or an interposer chips and/or active semiconductor chips that are embedded within a stacked assembly of chips.

LCD methods permit the integration of high chemical complexity electroceramics on a buried microelectronic layer with the requisite chemical precision to make the finished product economically viable. It enables chemically complex electroceramics to be selectively deposited on a semiconductor surface at temperatures that do not damage embedded active circuitry. It further enables the integration of chemically complex electroceramics with atomic scale chemical uniformity and uniform microstructure, including microstructure that has nanoscale uniformity irrespective of electroceramic chemical complexity.

Figure 1B:
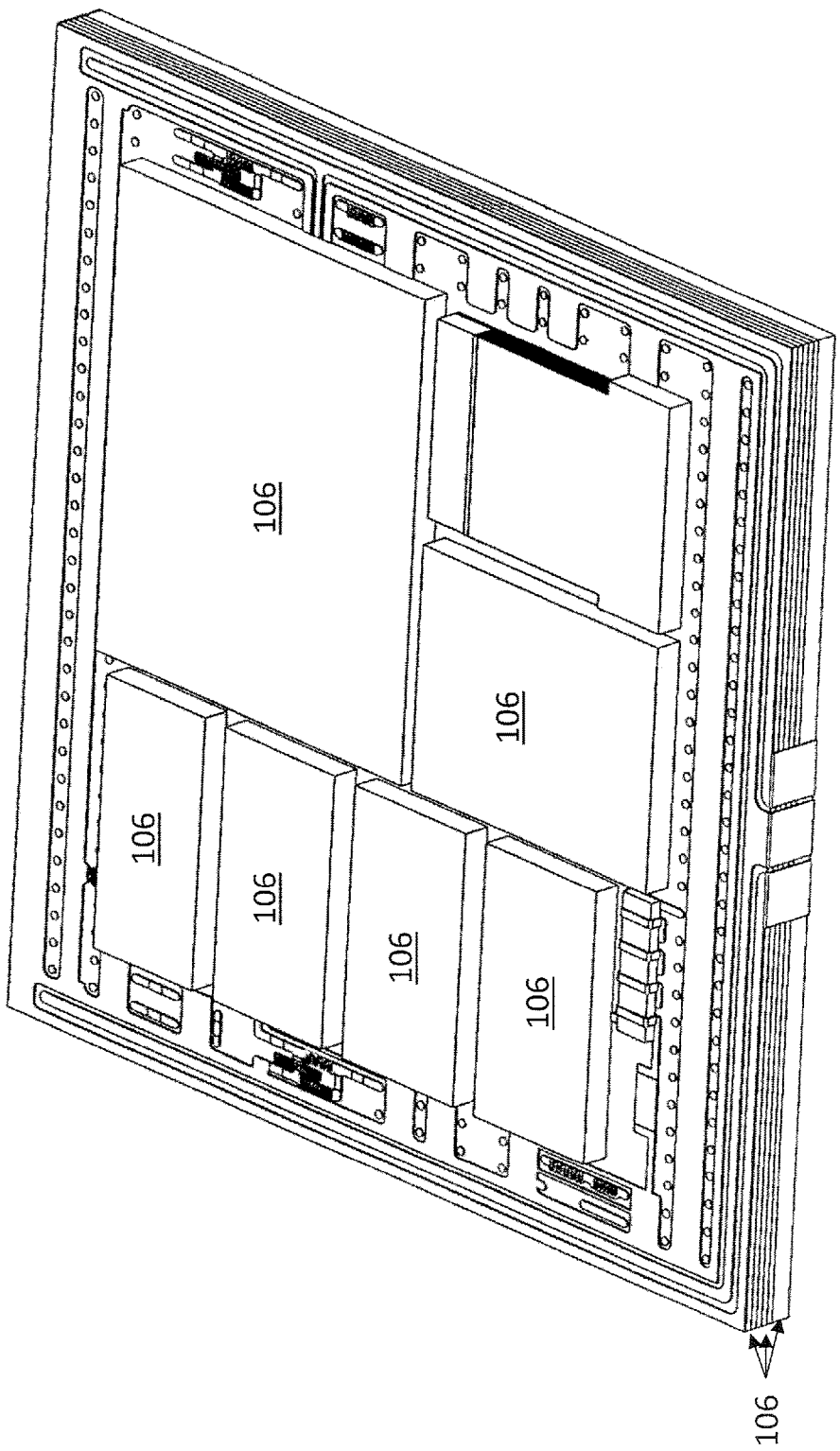

Reference is now made to FIGS. 1A,1B to illustrate a hybrid computer module 1 comprising high speed semiconductor chip stacks 2 mounted upon or integrated upon a semiconductor carrier 4. The hybrid computer module 1 may optionally comprise a power management device 6 mounted or integrated upon the surface of the semiconductor carrier 4. The power management device 6 may additionally comprise a resonant gate transistor 8 configured as a surface or vertical FET. FIG. 1A depicts a vertical FET embedded beneath the drain electrode. The power management device 6 comprising the resonant gate transistor 8, with additional art disclosed herein, enables large currents to be switched at microprocessor clock speeds without generating significant heat. The power management device 6 thus enables flow of data and instruction sets to be managed in sync with the processor clock, thus eliminating any need for cache memory that does not allow individual elements in cache to be individually addressed. The larger number of programming stacks relegated FORTH engine architectures to embedded processor applications as the need the industry developed greater dependencies on cache memory systems.

LCD methods enable passive circuitry that meet critical performance tolerances to be formed on the surface of metallic, dielectric, or semiconducting substrates at process temperatures that will not alter the diffusion profiles of any active circuitry embedded within a fully processed semiconductor wafer. Passive circuitry comprising resistors, inductors, and capacitors is used to tune and filter operational signal frequencies. The $100s of billions invested in miniaturizing transistors are not generating great growth returns because the moment these higher speed semiconductor chips are electrically connected to a printed circuit board, their intrinsic clock speeds throttle down from ≥20 GHz to 2.5 GHz to 3.4 GHz. Commodity materials used to form the printed circuit board ("PCB") and the discrete passive circuit components that are mounted on the PCB distort higher frequency signal components that are needed to shape the high speed digital pulse. Therefore, means that allow system clock speeds to optimally match the intrinsic clock speeds of the chips that comprise the system.

Printed circuit boards are required in microelectronic assemblies because inductors and capacitors have loose performance tolerances (typically ±10%) and do not keep their performance values stable with temperature. As a result, these passive components are mounted on a printed circuit board where they can be easily replaced when one or more of them cause the system to be so far out of tune over any specified operational temperature that it fails final system test. If passive components were integrated on a buried layer in the microelectronic system, where they could not be accessed and replaced, the entire value work product value of the fully assembled system would have to be scrapped when it fails final test. Financial losses from the known failure rates that would be generated by embedding ceramic passive components processed from powder precursors on a buried microelectronic layer is sufficiently high that the number of fully assembled systems that could no longer be reworked and scrapped would eat up sufficient economic value to make microelectronic systems unaffordable for commercial distribution at a profit.

A tighter performance standard, defined as critical performance tolerances, is required to reliably embed passive circuitry on a buried microelectronic and eliminate subsequent rework risks. Consequently, semiconductor die having intrinsic clock speeds that run at ≥20 GHz must lower their operational clock speeds down to 2.5 GHz to 3.4 GHz when mounted on a printed circuit board. The higher signal frequencies needed to shape the digital pulse are distorted slow dielectric polarization response times of the materials incorporated within the printed circuit board and the passive components mounted upon it. Therefore, it is desirable to improve computational speeds by displacing PCBs from microelectronic assemblies by means of integrating passive circuit elements that satisfy critical performance tolerances on the surface of semiconductor die that can be assembled in chip stack with profitable productive yields. A preferred embodiment of the application utilizes dielectrics in the passive circuitry wherein capacitive dielectric elements have high energy density and maintain a paraelectric phase, which means the internal polarization of the dielectric is solely generated by orbital deformations and polarize in the presence of and depolarize in the absence of an external electric field on femto-second time scales. Systems constructed with these means will not distort the higher frequency signal components shaping the high speed digital pulse, and, thus, optimally perform at the intrinsic clock speeds of the semiconductor die forming the fully assembled circuit module.

de Rochemont '839 and de Rochemont and Kovacs '814, incorporated herein by reference, disclose means to form passive circuit elements 10 that comprise electroceramic dielectric members 12 wherein the electroceramic dielectric members 12 that determine passive component performance hold passive components performance values to a high precision that keeps their performance within ±1% of design specifications over required operating temperatures. These tight tolerances define the critical performance tolerances that a prerequisite to integrating passive circuit elements at the wafer scale. This means further enables wafer scale integration of these materials at temperatures that do not alter diffusion of dopant profiles of active circuitry embedded within a semiconductor wafer. This means claim in de Rochemont '839 and de Rochemont and Kovacs '814 further enable an arbitrarily large number of atomic elements to be incorporated with the electroceramic dielectric member 12 to produce electroceramic dielectric members 12 having high energy density that simultaneously satisfy critical performance tolerances. High dielectric densities are defined as electroceramic dielectric members 12 that have a relative permittivity ($\varepsilon_R$) in excess of $\varepsilon_R$.=40, preferably in excess of $\varepsilon_R$.=200, or have a relative permeability ($\mu_R$) in excess of $\mu_R$.=10, preferably in excess of $\mu_R$. =100.

The nanoscale microstructure of these capacitive dielectrics maintains a paraelectric phase, wherein the polarization response is uniquely determined by orbital deformations. This allows electroceramic dielectric members 12 within capacitive passive components 10 to respond in phase to the presence or absence of an external field modulated up to petahertz (PHz), or $10^{18}$ cycles per second, signaling frequencies. These means enables the construction of embedded passive circuitry that operates without distortion well into the terahertz (THz) frequency domain. Capacitive dielectric elements comprising nanoscale microstructures displace any need for printed circuit boards in any and all microelectronic assemblies, including hybrid computing modules. It is therefore a desirable aspect of the present application to claim hybrid computing modules, servers, and server farms that do not comprise a single printed circuit board.

de Rochemont '385, incorporated herein by reference, instructs means to eliminate cache memory and effectively introduce minimal instruction set computing by means of a FORTH engine. FORTH engines have a processing architecture based upon the FORTH computer language that utilizes minimal instructions sets and greatly reduces the complexity with a streamlined interface that uses separate buses to access memory holding the data stack, return stack, a register, and the program memory. This feature allows a FORTH engine to access all of these memory spaces simultaneously in a single microprocessor clock cycle. FORTH engines, also known as $2^{nd}$-Generation Stack Processors, introduce remarkable power efficiencies that enable these processors to cut processor transistor counts 1,000-fold while processing 2,300 MIPS (million instructions per second).

The use of a power management device 6 comprising a resonant gate transistor 8 that eliminates a need for cache memory enables the great power efficiencies of FORTH engines to be repurposed to general use cases because a processor chip 106 mounted on the semiconductor carrier 4 or embedded within the high-speed chip stack 2 can now directly interact with large dynamic memory sets with system interrupts as a FORTH engine. The 1,000-fold drop in transistor counts enabled by FORTH engines as a core processor chip 106 thereby reduce the power consumption of a network server 102 from 100s of Watts to 100s of milli-Watts or micro-Watts, depending upon the technology node used to make the microprocessor.

de Rochemont '234, incorporated herein by reference, discloses means to integrate passive circuitry within a high speed semiconductor chip stack that enable the system clock speed of the chip stack to optimally function at the intrinsic clock speed of the slowest clock speed of any semiconductor die embedded within the chip stack. It is therefore a preferred embodiment of the invention to claim a server farm 100 or plurality of server farms 100, comprising servers 102 that further comprise hybrid computer modules 1 and high-speed chip stacks 2 configured for minimal instruction set computing by means of a FORTH engine enabled by a power management device 6 that additionally comprising a resonant gate transistor 8. These embodiments thereby enable the power consumption of a server farm 100 to be dropped from Mega-Watts per Hour (MW/Hr) down to Kilo-Watts per Hour (KW/Hr). This great savings in power consumption draws further distinction from the prior art through the use of hybrid computing module 1 or high speed chip stack 2 that optimally operate at the intrinsic clock speed of the slowest semiconductor die within the module 1 or stack 2 to boost processing speeds by roughly an order of magnitude or more.

Figure 2A:
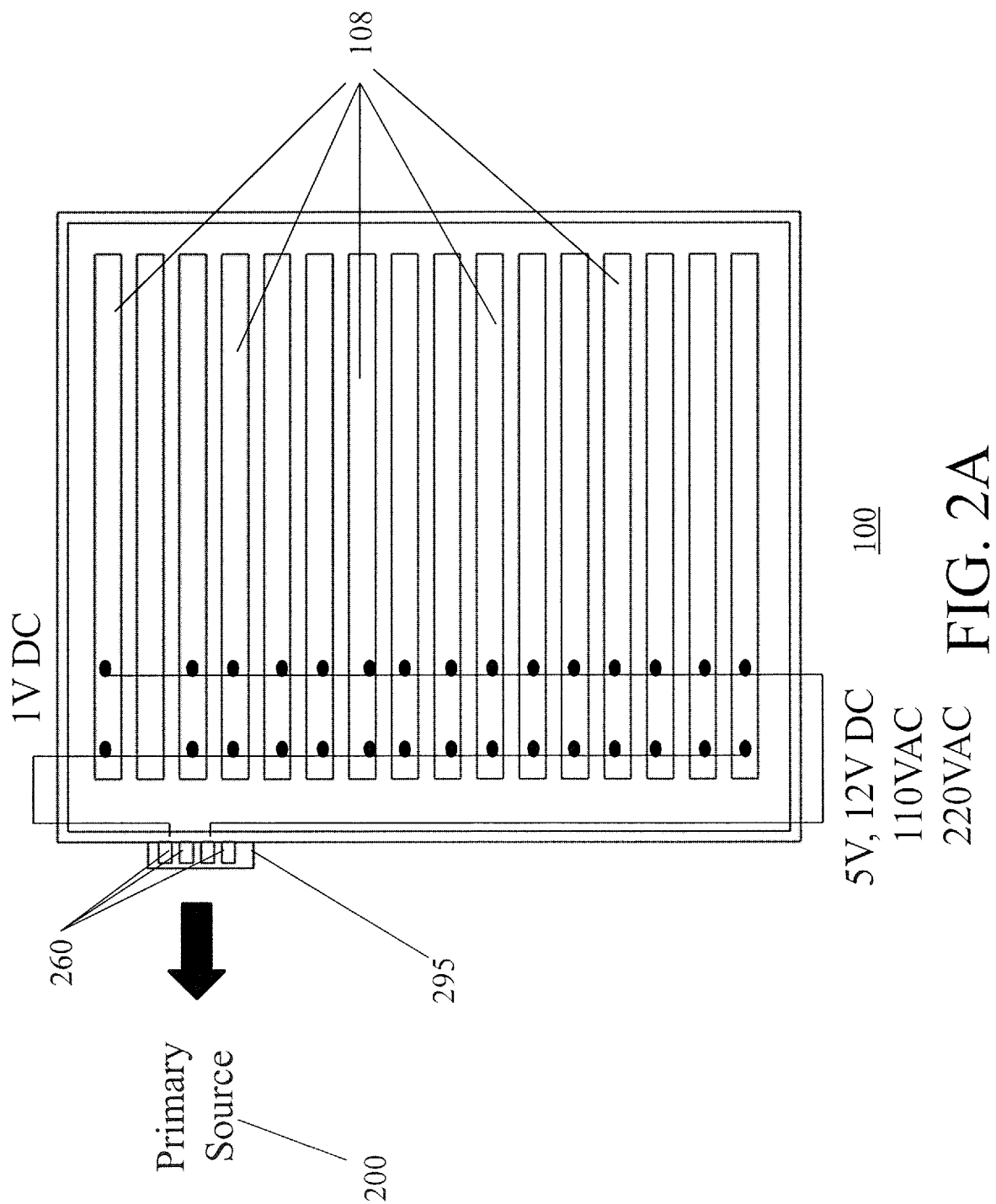
FIGS. 2A,2B,2C depict a hybrid computing module insert as a circuit card within a computing harness embedded within a server rack comprising a plurality of hybrid computing modules, wherein the server racks are inserted within a slots in a server tower, and one or more server towers are housed, preferably in sufficient numbers to form rows of server towers within a server farm.
Figure 2B:
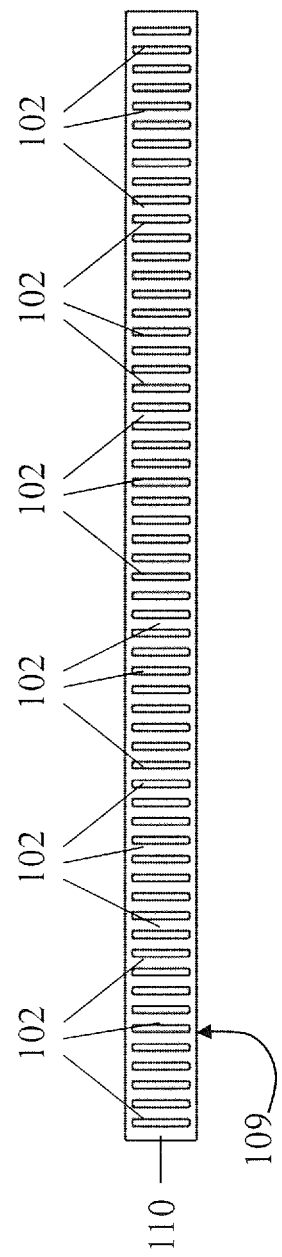
Figure 2C:
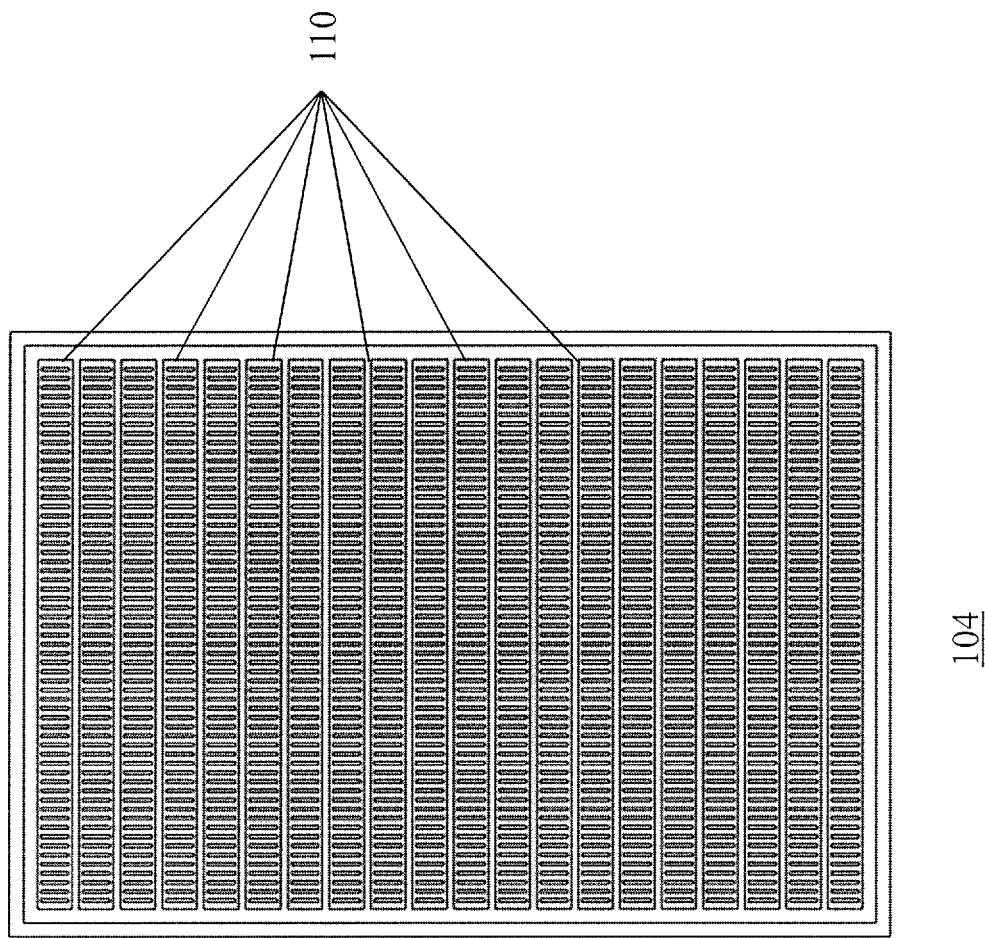

Reference is now made to FIGS. 2A,2B,2C to illustrate a preferred embodiment of the application, which is a server farm 100 that comprises a server 102, preferably a plurality of servers 102 inserted into slots in a server rack 110, wherein the server racks 110 are stacked to form a server tower 104, and the server towers 104 are a configured in rows 108 of server towers 104, wherein the server or servers 102 further comprise a hybrid computing module 1 and the hybrid computing module 1 that comprises further still a high speed semiconductor chip stack 2. It is an additional embodiment of the invention for the hybrid computing module 1 to be configured for Minimal Instruction Set Computing by means of a stack processor or FORTH engine as one of the semiconductor die 106 embedded within or mounted upon the high speed semiconductor chip stack 2.

A characteristic of the hybrid computing module 1, as instructed by de Rochemont '385, is its ability to be tasked for general purpose applications without a need for cache memory. This feature enables a return to simpler information architectures, such as Stack Machine Architectures. A microprocessor configured as a FORTH engine can process 1,000s of MIPS (millions of instructions per second) while consuming milli-Watts or micro-Watts (depending upon the technology node used to fabricate the semiconductor IC). A Stack Machine Architectures more efficiently processes recursive and deeply nested loop algorithms with an efficiency that is 50% greater than iterative algorithms. Slack machine processors are correspondingly less efficient (50%) in processing iterative algorithms, but that is an negligible drawback in favor of the prior art when the higher system clock speeds and enormous power efficiencies are brought into consideration.

Cache memory and predictive algorithms were introduced as microprocessor clock speeds began surpassing the speed at which memory feed data and instruction sets into the system. Cache memory systems usually operate on Last-in/First-Out (LIFO) and cannot independently access items in the program stack, so they only use iterative algorithms. This constraint displaced the efficiencies of true recursive and deeply nested loop algorithms from computing information architectures, forcing tasks requiring recursive or deeply nested loop calculations to be rewritten as iterative algorithms. The linear rigidity of cache memory constraints requires sophisticated predictive algorithms to feed program stacks into the microprocessor in accordance with what the predictive algorithm concluded were the most probably strings of instruction sets and data that will be needed to serve a general purpose environment.

Since predictive algorithms are not 100% accurate, cache memory swaps account for most of a microprocessor's power consumption. Since stack machine information architectures require one program stack for operands and a second program stack for operators, these simpler architectures got displaced as cache memory entered the market. It is therefore a preferred embodiment of the invention for the hybrid computing module to call program stacks directly from main memory with little or no reliance on cache memory systems. It is an additional embodiment of the invention for the server farm 100 to comprise servers that manage some functions using stack machine architectures and further comprise a hybrid computing module 1 that includes a high speed semiconductor chip stack 2, which additionally comprises a semiconductor die 106 that operates using Stack Machine Architecture by means as a FORTH engine or any computer language or machine language that operates in a functional capacity similar to FORTH.

Memory storage is also another source for power losses in server farms. It is therefore desirable to develop means that mitigates power losses derived from memory devices. X-Point (Cross Point) memory systems are a nonvolatile semiconductor memory that uses a memory storage medium whose resistance can be changed by an applied voltage rather than storing memory bits as charge stored beneath an electrode that continually consumes energy refreshing the stored charged state as is the case with dynamic random access memory (DRAM). An embodiment of the invention claims a hybrid computing module 1 or high-speed chip stack 2 that comprises at least one semiconductor die 106 that is an X-Point (Cross Point) memory system or device 130 to eliminate power consumed refreshing the charge states that form a bit and the energy expended clocking the bits as charged states into cache memory. X-Point memory systems or devices 130 read the data bit by reading the voltage drop across the memory element (read voltage), making them far more power efficient than other random-access memory systems. Another preferred embodiment of the application includes the use or a power management device 6, preferably a power management device 6 that incorporates a resonant gate transistor 8 as a power switch, forms a bit pulse by reading the voltage located in one resistive element in one specific address location on the semiconductor die 6 that forms the X-Point (Cross Point) memory system 130. An additional preferred embodiment of the application includes the use of a power management device 6, preferably a power management device 6 that incorporates a resonant gate transistor 8 as a power switch, wherein the power management device 6 forms a plurality of bit pulses by reading the voltages located across a plurality or string of resistive elements across a plurality of memory addresses within a X-Point (Cross-Point) memory system 130 to simultaneously form a plurality bit pulses as bit string during a single processor clock cycle. It is a further embodiment of the application that the bit string so constructed is interpreted either as word, or plurality of words. It is also desirable for these words to be independently directed over a plurality of bus interfaces that include, but not limited to, a data stack bus, a return stack bus, a register bus, a program memory bus, to allow the words simultaneous input/output from a semiconductor (processor) die 106.

Furthermore, since a resistive element can comprise a plurality of different memory states, a single memory address can be used to store a data byte or word at a single memory address to increase memory densities and reduce power consumption. It is therefore a preferred embodiment of this invention for the server farm 100 to comprise servers 102, further comprising a hybrid computing module 1 or a high speed semiconductor chip stack 2 that further includes a semiconductor die 106 function as a nonvolatile X-Point (Cross Point) semiconductor memory system 130.

Individual servers 102 comprising hybrid computing modules 1 essentially comprise the volume of a modern circuit card. This size reduction allows a plurality of servers 102 to be interfaced within a harness 109 embedded within a server rack 110, wherein the server rack 110 comprising a plurality of servers 102 occupies the volume of a slot in a conventional server rack, thus allowing a plurality of servers 102 to be inserted into the harness 110. The server racks 110 populated with a plurality individual servers 102 are inserted into rack slots within a server tower 104. The server towers 104 are assembled into rows 108 of server towers 104. It is a preferred embodiment of the application that harnesses 109 are designed to provide an optical interface between the hybrid computing modules 1 within a server 102, server rack 110, server tower 104, and rows 108 of server towers 104 within a server farm 100. Power management devices 6 and resonant gate transistors 8 may be embodied with the harness 100.

Reference is now made to FIGS. 2A, 3A, 3B, 3C, 3D, 3E, 3F, 3G to illustrate means to improve power management efficiencies when transferring power from a primary electrical source 200, be it a high voltage (≥600 VDC) battery or from the power grid 201. The power grid transports AC electricity directly from the generating station 202 through a generating set up transformer 204 that transforms the power to propagate long distances over transmission lines with minimal loss. Transmission line 206 voltages emanating from the generating set up transformer range among 765 KVAC, 500 KVAC, 345 KVAC, 230 KVAC, or 138 KVAC. Large power consuming applications, such as semiconductor tabs or data centers/server farms, will draw power directly from the transmission lines as a transmission customer 208, typically drawing in power at 138 KVAC or 230 KVAC. Substation step down transformers 210 are used to directly supply sub-transmission customers 212 that draw power at 26KVAC and 69KVAC. Primary customers 214 draw power at 13KVAC and 4KVAC downstream from the sub-transmission customers 212. Secondary customers 216 primarily comprise family households and draw power at 120 VAC and 240 VAC downstream from the primary customers 214.

Losses in delivering electric power from the power grid to the various utility customers 208,210,214,216 are primarily derived from power management stages that condition the power into a format (specific voltage in an AC or DC mode) that is most useful to the customers 208,210,214,216. Losses get compounded by having to pass the electrical power through multiple power management stages. It is therefore desirable to develop high efficiency power management stages 260 that condition power available directly from a power source 200. Power management stages typically comprise a transformer stage that transforms an AC high voltage to an AC low voltage (step down) or transform an AC low voltage to an AC high voltage (step up). A power management stage may also comprise an inverter stage the reconditions a DC voltage to AC voltage (step up or step down). A power management stage may also comprise an inverter stage that converts an AC voltage to DC voltage to charge a battery. The power management stage may also comprise one or more converter stages that convert a DC voltage/current to a different DC voltage/current (step up or step down). It is herein understood that a high efficiency power management stage 260 may perform any of these functions but does so using 1-2 power management stages 260 when drawing electrical power drawn any primary source 200 and conditioning to any voltage level AC or DC used within the server farm 100. Each high efficiency power management stage 260 is designed to have greater than 95% power efficiency, preferably greater than 98% power efficiency, introducing substantial power loss reductions when extracting power directly from the power grid 201.

Today, three (3) DC power management stages are needed to step down 120V AC or 600 VDC voltages drawn from a primary electrical source 200 down to the 1 VDC power levels that power semiconductor chips 106 in a server 102. Modern high efficiency DC-DC power management stages operate with 91%-93% conversion efficiencies. Multiple modern power management stages are needed convert 120 VDC to 1 VDC and will have an overall efficiency of 75%-80%, losing 20%-25% of the power available at 120 VAC or 600 VDC. Higher losses are generated when transforming/inverting/converting directly from the primary electrical source 200 through a significantly longer string or power management stages.

An important aspect of the application is to minimize power losses in a server farm 100 by minimizing the number of power management stages 260 to 1-2 when managing the delivery of power from any primary electrical source 200. The power management stage 260 comprises one or more high efficiency power management modules 218 and conditions the electricity available from a primary electrical source 200 to any of the voltages (AC or DC) consumed by the server farm 100. The reduction achieved in the number of power management stages needed in a high efficiency power management stage 260 is achieved by improving the power efficiency or minimizing power losses within every functional element used within in the high efficiency power management module 218 and by maximizing the sustainable differential voltages across all the transformer coil 220 windings 224 used within the power management stage 260.

Nearly all high efficiency power management modules 218 comprise a transformer coil 220, one or more power transistors, resistors, and capacitors integrated into a single solid state body. Some DC-DC converter and AC-DC converter topologies substitute the transformer cod with an inductor coil. Permeability ($\mu$) is a measure of a material's ability to amplify magnetic flux densities in the presence of a magnetic field. Permeability ($\mu$) is also inversely proportional to the magnetic reluctance ($\mathfrak{R}$) of a magnetic circuit. Reluctance ($\mathfrak{R}$) is akin to electrical resistance in electrical circuits as magnetic flux lines be directed around low permeability circuit elements. Just as high conductivity electrical conductors store very little electrical energy internally within their bodies, high permeability magnetic materials store little magnetic energy internally within their bodies. Similarly, just as electrical charge bypasses high-resistivity/low-conductivity conductive paths in favor or low-resistivity/high-conductivity paths, magnetic flux lines deviate around low permeability/high reluctance paths in favor of flowing through high permeability/low reluctance paths. Low permeability/high reluctance dielectric media stores more magnetic energy, just has low conductivity/high resistivity dielectric media stores more electrical energy.

A material's permeability ($\mu$) is the product of the permeability of free space ($\mu_o$) and a material body's relative permeability ($\mu_R$), ($\mu = \mu_o \mu_R$). Higher magnetic flux densities are generated in material bodies having higher relative permeability ($\mu_R$). Magnetic flux density ($\mathcal{B}$) represents the strength of a magnetic current. The magnetic flux density generated by a single ampere-turn (A/m) in a material body having $\mu_R = 100$ will be 100× greater than it is a non-magnetic material body having relative permeability $\mu_R = 1$. Higher magnetic flux density, $\mathcal{B}$, generates greater self-inductance (L) within the inductor coil or transformer coils 220. Inductance, L, is measured in Henrys or Joules-Ampere-$^{-2}$ (J/A$^2$) or Weber-Ampere-$^{-1}$ (Wb/A), wherein a Weber is the density of magnetic flux within an area of 1 square meter (m$^2$) needed to generate 1 Tesla (T) from a unit of magnetic field strength, $\mathcal{H}$, measured as a the magnetic field generated when single ampere (A) circulating over a turn having a path length of 1 meter (A-m$^{-1}$).

Therefore it is desirable element of the application for magnetic components within a power management stage 260 to comprise magnetic core materials 222 that have maximal permeability ($\mu$) to transform, invert, convert maximal energy (Joules) in a single power management stage 260 per unit of current (Amperes) input to the stage. Higher magnetic flux densities, and higher magnetic currents, within the magnetic core 222 of an inductor coil or transformer coil 220 generate higher inductances that reduce the physical size of the inductor coil or transformer coils. Smaller component sizes reduce conductive losses within the high efficiency power management modules 218. A specific embodiment of the invention claims magnetic core materials 222 that comprise a high energy density electroceramic member 12 that has a relative permeability $\mu_R \geq 20$, preferably a relative permeability $\mu_R \geq 100$, most preferably a relative permeability $\mu_R \geq 400$.

Primary loss mechanisms within any power management stage are magnetic core losses generated within inductor coils and transformer coils, proximity losses and flux jumping losses generated in inductor and transformer coils. On-Resistance generated at the junctions of power transistors, resistive losses generated in conductive elements and resistors, and dissipation losses generated in capacitors. Spurious noise created by electromagnetic interference (EMI) is also detrimental to the operational efficiency of a power management stage. Therefore, means that minimize or neutralize all these loss mechanisms and operational inefficiencies are necessary to from a high efficiency power management module 218 and are desirable elements for improving the power efficiency of server farms 100 claimed in this application, as well as all other power electronics used in electrical systems.

de Rochemont '708, incorporated herein by reference, instructs means to reduce power loss in magnetic core material 222 by embedding thin layers ($\leq 1$ µm) of amorphous silica 224 within the magnetic core 222 to kill eddy current losses. Eddy currents are a major loss mechanism at switching frequencies at UHF frequencies and above. Amorphous silica is the most electromagnetically lossless industrial material and supports the highest dielectric breakdown voltage of all industrial materials. It is therefore desirable for the high efficiency power management module 218 to comprise a magnetic core material 222 that comprises embedded amorphous silica layers 225 and high energy density electroceramic members 12. Since higher resistance magnetic materials generate smaller Eddy currents, another preferred embodiment incorporates high energy density electroceramic members 12 having electrical resistivity $\geq 10^5$ $\Omega$-cm, preferably greater than $\geq 10^8$ $\Omega$-cm.

Preferred high energy density electroceramic members 12 within the magnetic core materials 222 comprise ferrite electroceramic when subjected to modulating electromagnetic field frequencies less that 20 MHz. Preferred high energy density electroceramic members 12 within the magnetic core materials 222 comprise hexa-ferrite electroceramic when subjected to modulating electromagnetic field frequencies in the UHF/VHF frequency bands. Preferred high energy density electroceramic members 12 within the magnetic core materials 222 comprise garnets, preferably silica garnets when subjected to modulating electromagnetic field frequencies in excess of 1 GHz.

Higher resistivity magnetic core material 222 is another means of reducing Eddy current loses. Higher resistivity is obtained when using magnetic materials comprising any of the following atomic elements: nickel (Ni), cobalt (Co), zinc (Zn), copper (Cu), titanium (Ti), and chromium (Cr). It is therefore a desirable aspect of the application for the magnetic core material 222 within a high efficiency power management stage 260 or an inductor coil or transformer coils 220 to comprise high energy density electroceramic members 12 that further comprise, nickel (Ni), cobalt (Co), zinc (Zn), copper (Cu), titanium (Ti), and chromium (Cr).

Reducing hysteresis losses within the magnetic core material 222 is another means of improving the efficiency of inductor coil and transformer coils 220 within a power management stage 260. Lower hysteresis loss is obtained when using magnetic materials comprising any of the following elements: lead (Pb), strontium (Sr), and magnesium (Mg). It is therefore a desirable aspect of the application for the magnetic core material 222 within a high efficiency power management stage 260 or an inductor coil or transformer coils 220 to comprise high energy density electroceramic members 12 that further comprise: lead (Pb), strontium (Sr), and magnesium (Mg).

de Rochemont '708 instructs means to instill uniform electroceramic grain size that optimizes magnetic permeability while minimizing magnetic flux residual losses within the high energy density electroceramic member 12 of a magnetic core material 222. Residual loss is the dominant loss mechanism in magnetic core materials 222 at modulation frequencies above 20 MHz. It is therefore desirable for the high efficiency power management module 218 to comprise a magnetic core material 222 that comprises high energy density electroceramic member 12, preferably a silicon garnet electroceramic that maintains high magnetic permeability ($\mu_R$) above 1 GHz switching speeds, with a microstructure having uniform grain size distribution size not greater than 7 µm in diameter, preferably uniform grain size distribution having uniform grain size diameter in the range of 5-7 µm.

de Rochemont 708 also instructs means to encapsulate coil windings 224 with enveloping amorphous silica dielectric 226 to enable transformers and inductors that sustain very large differential voltage drops, including 100s of KV differential voltages, between coil windings 224 without generating electrical arcing between coil windings 224 in the inductor coil or transformer coils 220. It is therefore desirable for the high efficiency power management stage 260 to comprise an inductor coil or transformer coils 220 wherein the coil windings 224 are encapsulated with an enveloping amorphous silica dielectric 226.

de Rochemont 708 instructs means that impart coil windings with high hardness constraining members 228 are located at the center of a coil winding 224. High hardness constraining members 228 are enveloped by low resistivity conducting elements 230 having resistivity less than $10^{-5}$ Ω-cm, preferably with resistivity less than $10^{-7}$ Ω-cm. Low resistivity conducting elements 230 typically have high coefficients of thermal expansion (CTE≥17 ppm/° C.) that do not match well with amorphous silica's CTE of 0.5 ppm/° C. The CTE mismatch and brittleness of amorphous silica creates internal mechanical stress that crack the enveloping amorphous silica 226 when the transformer coil 220 is thermally cycled. High hardness constraining members 228 having tensile strength greater than 1 GPa and CTE values less than 2 ppm/° C., preferably a CTE value of 0.5 ppm/° C. that matches the CTE of amorphous silica, relieve any thermally induced stress on the enveloping amorphous silica dielectric 226 and the magnetic core material 222 because the expansion of the malleable conducting elements 230 is constrained.

Figure 3A:
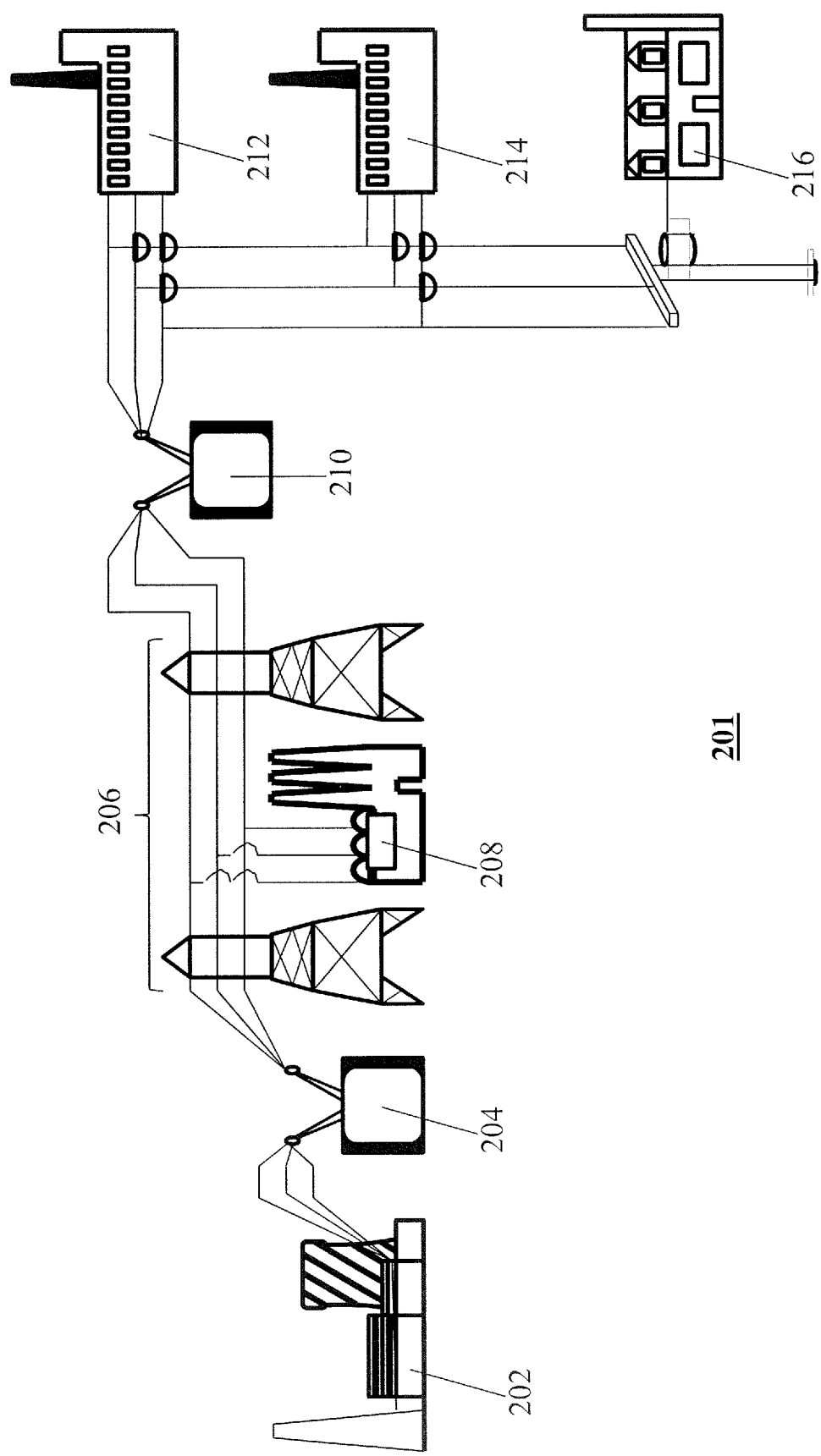
FIG. 3A,3B,3C,3D,3E,3F,3G depicts various embodiments and aspects of a high efficiency power management stage.
Figure 3B:
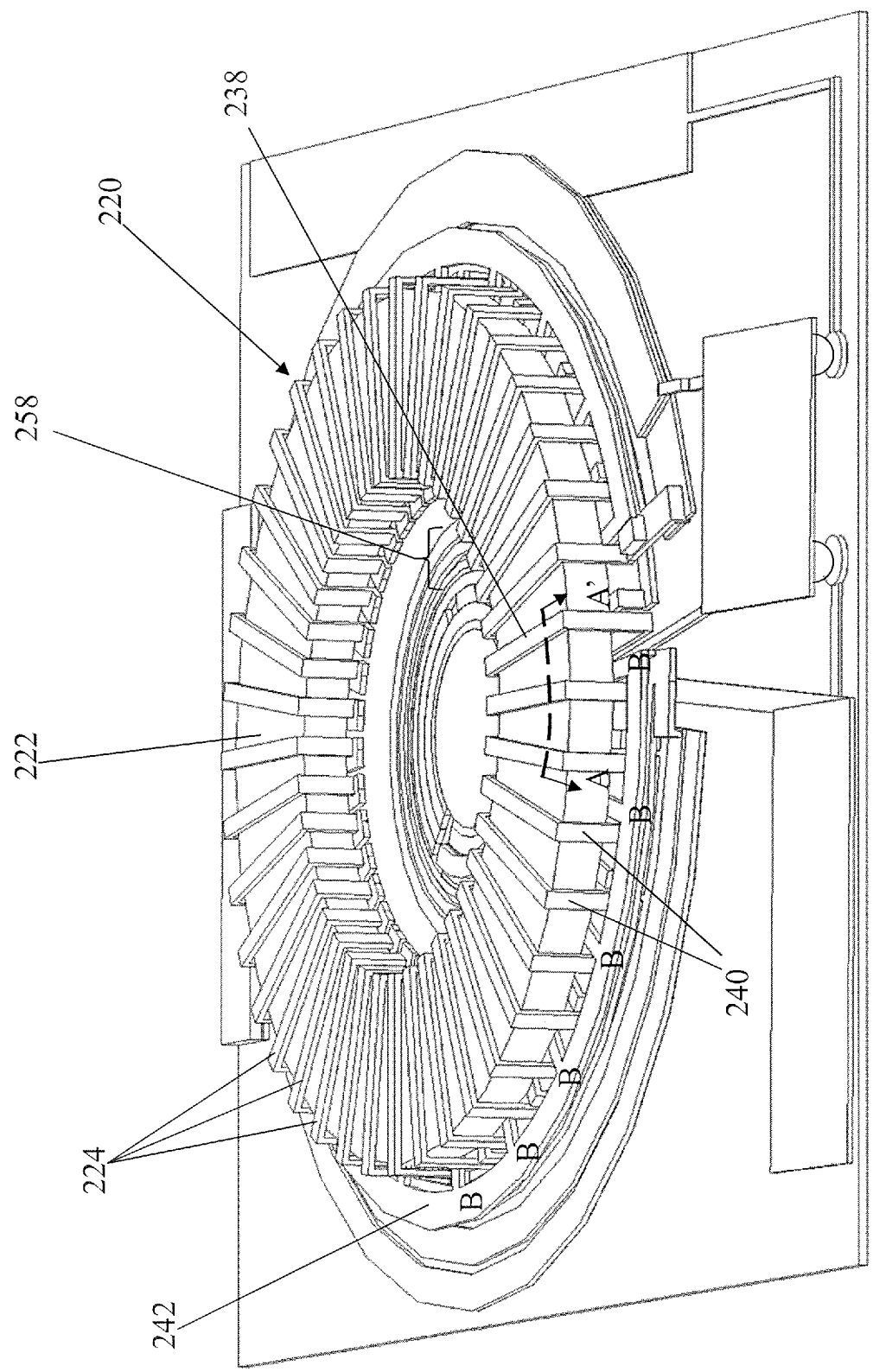

The inductor coil or transformer coils 220 remain in greater mechanical balance as it is thermally cycled with most of the mechanical stress and strain located in the high hardness constraining members 228. It is therefore a preferred embodiment of the application for the high efficiency power management module 218 to comprise high hardness constraining members 228 within the cod windings 224. The high hardness constraining members 228 are selected to have thermal coefficients of expansion that optimally match the thermal coefficients of expansion of the enveloping amorphous silica dielectric 226 and the magnetic core material 222. Magnetic core material 222 is mechanically constrained internally by embedded amorphous silica layers 225 and externally by the enveloping amorphous silica dielectric 226. A further preferred embodiment of the application is a power management module 218 wherein the high hardness constraining members 228 comprise low CTE ceramics having CTE≈0.5 ppm/° C. or low CTE ceramics in layered combinations with MAX-phase carbide ceramics as thermal management elements within the windings to facilitate waste heat management, preferably through a thermoelectric device 280, more preferably through a thermoelectric device 280 comprising a 3D quantum gas as instructed in de Rochemont '302/ de Rochemont 708 instructs means of forming toroidal inductor coils and toroidal transformer coils 220 that minimize spurious signal noise generated from EMI created by magnetic currents that follow an open current path. Magnetic currents within toroidal coil structures (as depicted in FIG. 3B) follow a closed magnetic path, wherein the magnetic flux lines are contained completely within the body of the transformer coil 220. Closed magnetic current paths emit greatly reduce spurious noise and EMI. Therefore, a preferred embodiment of the application is a high efficiency power management stage 260 or high efficiency power management module 218 that comprises an inductor coil or transformer coils 224 further comprising toroidal geometry, wherein the magnetic currents follow a closed magnetic path that terminates upon itself completely within the coil structure.

A specific benefit of this application that was instructed by de Rochemont 708 is the use of toroidal coil windings 224 that minimize proximity losses and flux jumping losses by maintaining consistent physical spacing between the coil windings 224 around the inductor or transformer coil 220. It is therefore a preferred embodiment of the application for a high efficiency power management stage 260 or a high efficiency power management module 218 to comprise toroidal inductor coils and transformer coils 220 wherein the toroidal inductor coil and transformer windings 224 maintain consistent spacing between one another to reduce flux jumping and proximity losses.

de Rochemont 708 instructs means of forming a toroidal transformer coil 220 that interleaves parallel coil windings with series coil windings to effectuate step up/step down voltage transformations within a toroidal transformer 220. These toroidal transformers 220 generate less parasitic noise and higher coupling efficiencies, it is therefore a preferred embodiment of the application for a high efficiency power management stage 260 or high efficiency power management module 218 to include toroidal transformers coils 220 with interleaved primary and secondary windings 224 are used to reduce parasitic noise and effectuate transformer turn ratios.

FIG. 3B illustrates a 20:1 step-up transformer configuration wherein the secondary coil 236 comprises 40 coil windings 224 in parallel configuration and the primary coil 238 comprises a single primary coil winding 232. In this instance, all parallel configurations comprise parallel groupings 240 of two winding coils 224 configured in series, wherein each parallel grouping makes its parallel connection to a ring conductor 242 at points B. The parallel grouping of two winding coils 224 configured in series evenly distributes the secondary current reduces the effective turn ratio $N_p/N_s$ by 2. A 20:1 step-down transformer configuration would switch secondary coil windings 234 for the primary coil windings 232 within the transformer 210 structure. It is an additional preferred embodiment is a high efficiency power management stage 260 or high efficiency power management 218 that comprises a toroidal inductor coil or transformer coils 220 that further comprise parallel groupings 240 of more than one winding coil 224 configured in series, wherein each parallel grouping makes its parallel connection to a ring conductor 242 tracing an arcuate path around the toroidal coil.

A desired benefit of the application is to form magnetic core materials 222 that reduce magnetic saturation and optimally store magnetic energy within a magnetic circuit generally, and specifically when the magnetic core material is part of a power management module 218. Magnetic saturation is the over excitation of the magnetic core material 222 when the magnetic field strength, H measured in amperes per meter (A-m$^{-1}$) generates a maximal flux density, ($\mathscr{B}$ measured in Tesla (T). As depicted by curve 245 in FIG. 3C, at magnetic saturation 246 the generation of higher magnetic field strengths $\mathscr{H}$ created by higher currents circulating within a coil ceases to induce higher magnetic flux densities $\mathcal{B}$. Magnetic saturation disrupts the linearity between input currents and curtails a linear response of the self-inductances (L) that transfer or store magnetic energy.

Another desired benefit is to mitigate abrupt transitions to magnetic saturation and maximizing energizing currents within an inductor coil or transformer coils 220. Yet another desired benefit is to increase magnetic energy coupling efficiencies between the magnetic core material and the secondary windings 234 within transformer coils 220 used in flyback transformers or an inductor coil 220 used for energy storage or power transfer.

These benefits are achieved by means of introducing one or more "air gaps" in conventional inductor and transformer coil structures. Higher energies and higher magnetic field strengths $\mathcal{H}$ are created by within inductor or transformer coils 220 by introducing dielectric discontinuities wherein low permeability/high reluctance media (like air) are inserted within magnetic core material 222. The fractional volume of low permeability media within magnetic core materials 222 lowers the effective permeability of the core materials 220 thereby allowing higher driving currents that impart greater magnetic field strengths and magnetic energy within the inductor or transformer coils 220 before the onset of magnetic saturation. Lower effective permeability of a magnetic core caused by "air gaps" allows higher electrical currents to energize the coils before the onset of magnetic saturation as shown in curve 247.

Energy generation benefits of the application include generating maximal magnetic flux densities at optimal locations used to drive the creation of magnetic flux within an inductor or transformer coils 220 and comprise any winding of (in the case of energy storing) an inductor coil 220 and the primary windings 232 of transformer coils wherein the magnetic core material 222 beneath the aforementioned windings comprises high relative permeability ($\mu_R$) in high energy density electroceramic members 12. The maximal positioning of high energy density electroceramic members 12 facilitates the generation of high magnetic flux densities that optimizes the self inductance of a coil and directional flow of strong magnetic currents within an inductor coil or transformer coils 220. Therefore, a desired aspect of the application maximizes magnetic flux generation within an inductor coil or transformer coils 220 by inserting a maximal volume of high energy density electroceramic members 12 beneath one or more windings 224 of an inductor coil 220 and beneath one more primary coil windings 232 within transformer coils 220. Maximal volumes for the occupied volume of high energy density electroceramic members 12 comprises the volume spanned by the cross-sectional area of the magnetic core material 222 and the longitudinal length 248 of the magnetic core material between dielectric discontinuities 231,235.

Although necessary for generating high flux density ($\mathcal{B}$) and high self-inductance (L) within an inductor coil or transformer coils 220, high relative permeability ($\mu_R$) bodies limit magnetic energy stored in the coils' magnetic core material 222. Means to optimize energy storage within an inductor coil or transformer coils 220 used in switched mode power supplies is desirable to improving the efficiency transferred power within a high efficiency power management stage 260.

Dielectric discontinuities in a magnetic core material 222 created by introducing air gaps or nonmagnetic dielectric elements into the body of the magnetic core material 222 store significant amounts of magnetic energy due to their lower relative permeability ($\mu_R$) and higher reluctance ($\mathcal{R}$). It is not possible, or at least very challenging, to introduce air gaps within a solid state device. The optimal alternative creates dielectric discontinuities by inserting a continuous volume of ultra-low loss amorphous silica dielectric 231 or a collection of small volume distributed amorphous silica dielectric members 233.

Amorphous silica is functionally superior to air when substituted into a dielectric discontinuity because amorphous silica dielectric members 231 are non-magnetic ($\mu_R=1$, like air), have loss tangent (tan $\delta$) as low as tan $\delta \sim 10^{-5}$, (like free space), and can sustain extremely high dielectric breakdown voltages (up to 10,000 KiloVolts-cm$^{-1}$). These performance values are not possible using air as a dielectric discontinuity.

Therefore, a preferred embodiment of the invention claims a server farm 100 comprising high efficiency power management modules 218 and high efficiency power management stages 260 that further comprise energy storing inductor or transformer coils 220 wherein the magnetic core materials 222 comprise further still amorphous silica dielectric 231 or a collection of small distributed volumes of amorphous silica dielectric 233 that are optimally positioned within the magnetic core material 222 immediately beneath one or more windings 224 of an inductor coil 220 designed for maximal energy storage or beneath one or more secondary coil windings 234 of a transformer coil 220 designed for maximal power transfer or for use as a flyback transformer in a switched mode power supply of a high efficiency power management module 218.

Optimal energy storage locations 249A,249B within the magnetic core material 222 of transformer coils 221) are in close or immediate proximity to the transformer's secondary coil windings 234 or at select windings 224 specified by design objectives for an energy storing inductor coil 222. Optimal magnetic energy storage locations 249A,249B comprise high energy density electroceramic members 12 having magnetic permeability ($\mu$), with relative permeability $\geq 20$, preferably $\geq 400$, and amorphous silica dielectric discontinuities 250,252. The volume of optimal magnetic energy storage locations 249A,249B comprises the volume spanned by the cross-sectional area of the magnetic core material 222 mapped within the winding 224 under which it is located and 1.2× the longitudinal length of the magnetic core material 222 that represents the width of said winding 224. Alternatively the volume of optimal magnetic energy storage locations 249B may comprise the volume spanned by the cross-sectional area of the magnetic core material 222 mapped within the winding 224 under which it is located and a longitudinal length 249B of the magnetic core material 222 that is less than or equal to the width 252 of said winding 224.

Figure 3C:
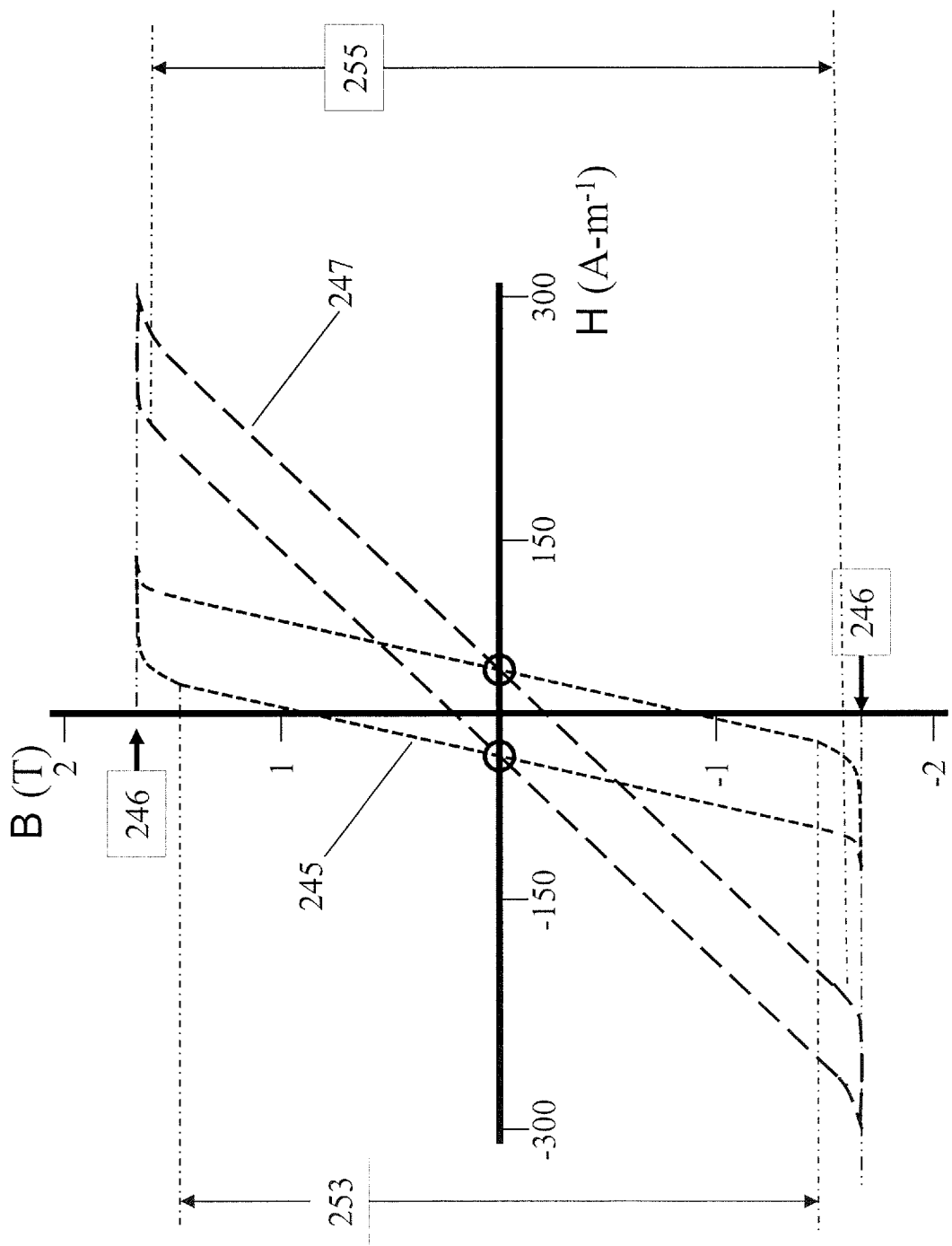
Figure 3D:
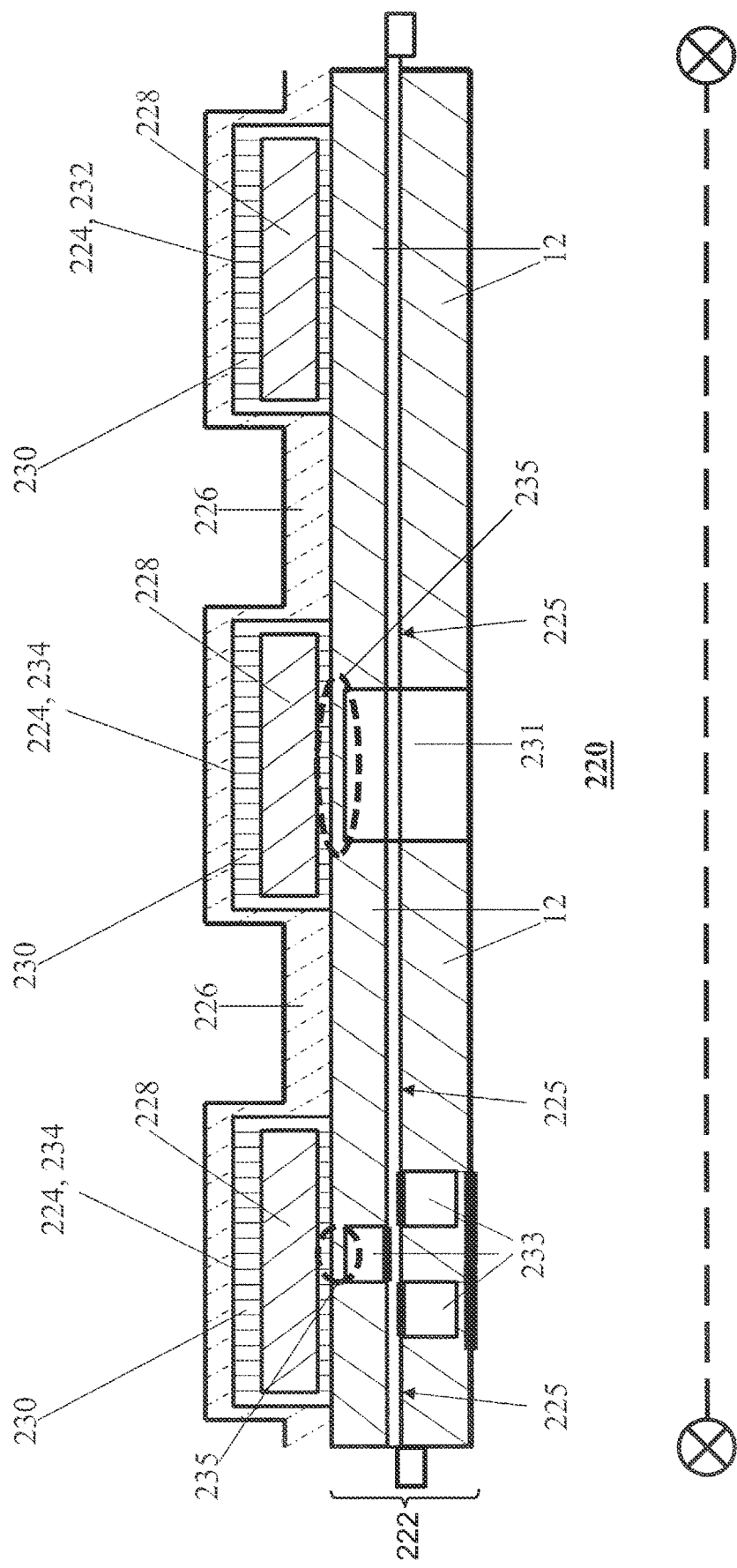
Figure 3E:
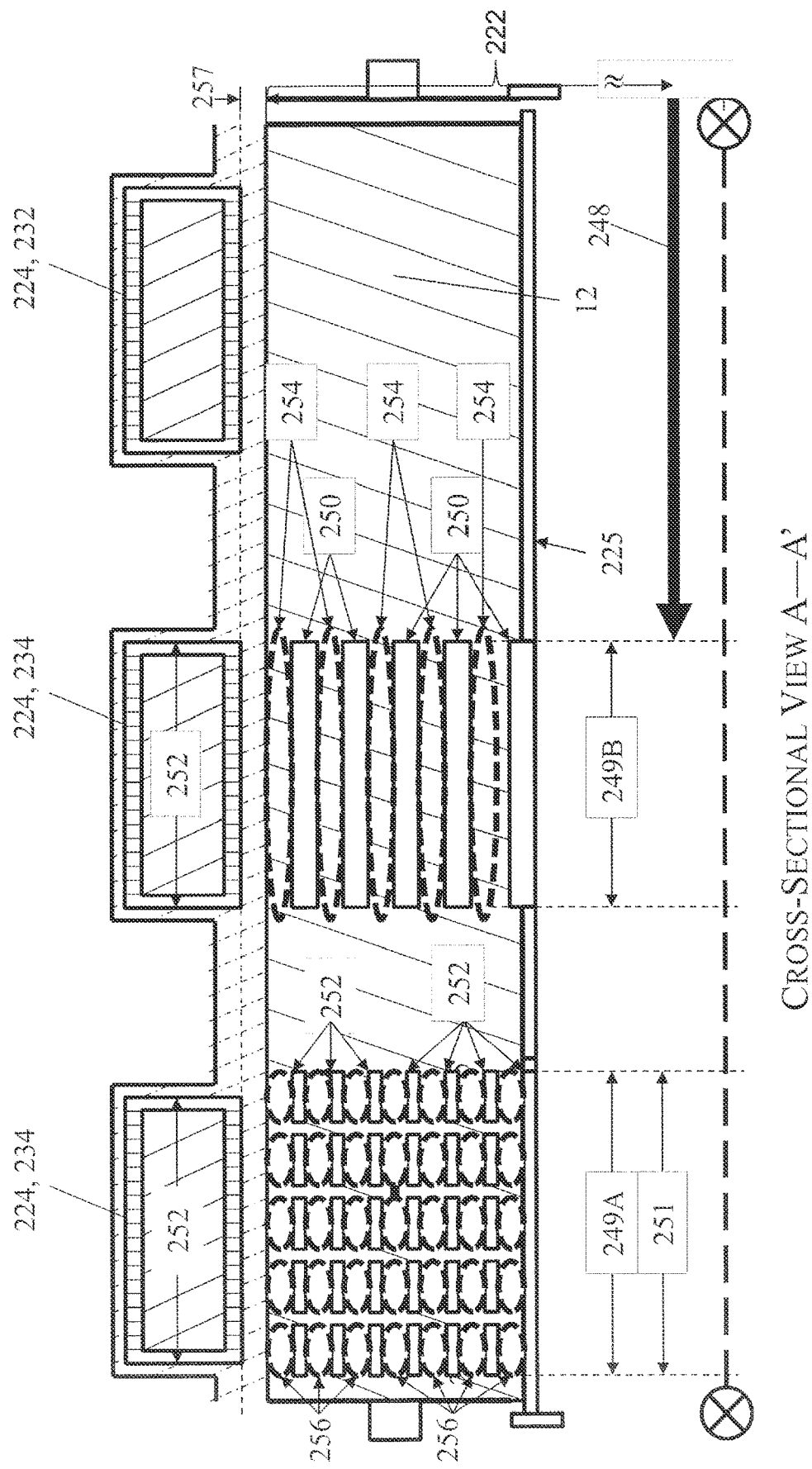

Optimally high currents passing through the winding of an inductor or transformer coils 220 will generate lines of magnetic Held strength $\mathcal{H}$ within the ranges of linearity 253,255 defined in FIG. 3C. The generated lines of magnetic field strength encircling around the closed longitudinal path defined by the toroidal inductor coil and transformer coils 220 will spread out with uniform density across the cross-sectional area of the magnetic core material 222.

The magnetic flux density $\mathcal{B}$ generated by the lines of magnetic field strength $\mathcal{H}$ will be dominated by the relative permeability ($\mu_R$) of the high energy density electroceramic members 12 since they constitute the majority of the fractional volume within the magnetic core material 222 that determines effective permeability ($\mu_{REff}$) of the inductor and transformer coils 220. Every line of magnetic field strength $\mathcal{H}$ within the coils will generate a magnetic flux density $\mathcal{B} = \mu_{REff} \times \mathcal{H}$ that distributes itself uniformly across the high energy density electroceramic members 12. However, within optimal magnetic energy storage locations 249A,249B the nonmagnetic amorphous silica dielectric discontinuities 250,252 will reduce magnetomagnetic forces (MMF) within their bodies and store magnetic energy by pushing magnetic flux lines into localized micro-volumes of extreme magnetic flux density 254,256 where the deviating lines of magnetic flux will concentrate. Optimally the dielectric discontinuities comprise a three-dimensional patterned array that stabilizes these volumes of extreme magnetic flux density 254,256 to induce maximal inductive coupling within the adjacent windings 224,235. This higher inductive coupling releases the magnetic energy stored within magnetic energy storage locations 249A,249B when the inductor coils and transformer coils 220 are reverse cycled and the volumes of extreme magnetic flux density snap back to a uniform density distribution. Spacing between the micro-volumes of extreme magnetic flux density should range between 1/10,000th the volume of the magnetic core material beneath the secondary winding to 1/10th that volume.

It is therefore a preferred embodiment of the application to preferentially locate magnetic energy storage locations 249A,249B embedded within the magnetic core materials 222 of an inductor coil or transformer coils 220 to produce localized volumes of extreme magnetic flux density 254,256 in immediate proximity to select windings 224 of an energy storing inductor coil and one or more secondary coil windings 234 within a flyback transformer, wherein the optimal magnetic energy storage locations comprise high energy density electro ceramic members 12 having magnetic permeability ($\mu$), with relative permeability $\mu_R \geq 20$, preferably $\mu_R \geq 400$, and amorphous silica dielectric discontinuities 250, 252.

It is an additional preferred embodiment of the application tor the volume of optimal magnetic energy storage locations 249A,249B to comprise the volume spanned by the cross-sectional area of the magnetic core material 222 mapped within the winding 224 under which it is located and 1.2× the longitudinal length 251 of the magnetic core material 222 that represents the width of said winding 224.

In another additional preferred embodiment of the application for the optimal magnetic energy storage locations 249B to comprise a volume spanned by the cross-sectional area of the magnetic core material 222 mapped within the winding 224 under which it is located and a longitudinal length of the magnetic core material 222 that is less than or equal to the width 252 of said winding 224.

Dielectric discontinuities 231,233,250,252 have relative permeability $\mu_R = 1$ and operate to keep magnetic flux densities $\mathcal{B} = \mathcal{H}$. The deviating lines of flux expelled from amorphous silica dielectric discontinuities 231,233,250,252 induce fringing fields that can generated Eddy current loses with windings 224. Toroidal inductor coils and transformer coils 220 form closed magnetic currents, which provide means to reduce spurious noise by minimizing Eddy current losses within the conductive elements 228 of windings 224. Toroidal coil geometries are that desirable feature of high efficiency power management modules 218 and high efficiency power management stages 260.

Another preferred embodiment of the application inserts an enveloping layer of nonmagnetic material 257 having $\mu_R = 1$ and preferably comprises amorphous silica dielectric and has sufficient thickness to redirect fringing lines of magnetic flux back into regions of the magnetic core material 222 comprising a high energy density electroceramic member 12.

It is herein understood that high dielectric density electroceramic members 12 comprising localized volumes of extreme magnetic flux density 254,256 are preferentially placed around all three dimensional borders of amorphous silica dielectric discontinuities 231,233,250,252 and said localized volumes are sufficiently large to minimize fringing fields penetrating into the conductive elements 228 of a winding 224.

de Rochemont '192 and '054, incorporated herein by reference, instruct art related to a Resonant Gate Transistor 258 that allows large currents to be switched at arbitrarily high speeds with minimal heat generation and power loss. A resonant gate transistor 258 embeds resonating inductance within a transistor gate having elongated gate width ($W_{gate}$) and very short gate length ($L_{gate}$). The resonating gate inductance offsets the characteristic low frequency pass band imposed by the gate's large capacitance, thereby enabling large currents to be switched or modulated at high resonant frequencies with negligible On-Resistance at the transistor junction to minimize power loss and heat generation. In addition to greatly reduced transistor losses when switch large currents, system switching losses are also greatly reduced.

This near loss-less high-frequency current modulation allows large time-averaged currents to be passed through the power switch at higher speeds in smaller current packets $\Delta I$. Each current packet $\Delta I$ injects an abrupt current spike that linearly decays to zero. Power switching losses are determined by:

$$P_{Loss} = (\Delta I)^2 R \quad (1)$$

where R is the resistance in the system,

Large currents are typically switched at speeds of 10 MHz through transistors that generate massive heat and have high junction losses due to their large On-Resistance. The resonant gates transistor's ability to switch at speeds of 10 GHz reduces $\Delta I$ 1,000-fold to achieve the same time-averaged current flow. Power switching loss, $P_{Loss}$, is thereby reduced a million told.

A preferred embodiment of the application claims high efficiency power management module 218 and high efficiency power management stage 260 comprising a resonant gate transistor 258 as a power switch or as an element within a fully integrated gyrator 300, an inductor coil or transformer coils 220, preferably toroidal inductor coil or transformer coils 220, comprising high energy density electroceramic dielectric members 12 within the magnetic core materials 222 optionally comprising optimal energy storage locations 249A,24915, windings 224 comprising high hardness constraining members 228, and enveloping amorphous silica dielectric 226 having sufficient thickness to electrically insulate an inductor coil or transformer coils 220 from arc discharges when the applied differential voltage drops between their windings 224 exceed 600 VAC, preferably exceed 1 KVAC, more preferably exceed 50 KVAC, and even more preferably exceed 250 KVAC.

Figure 3F:
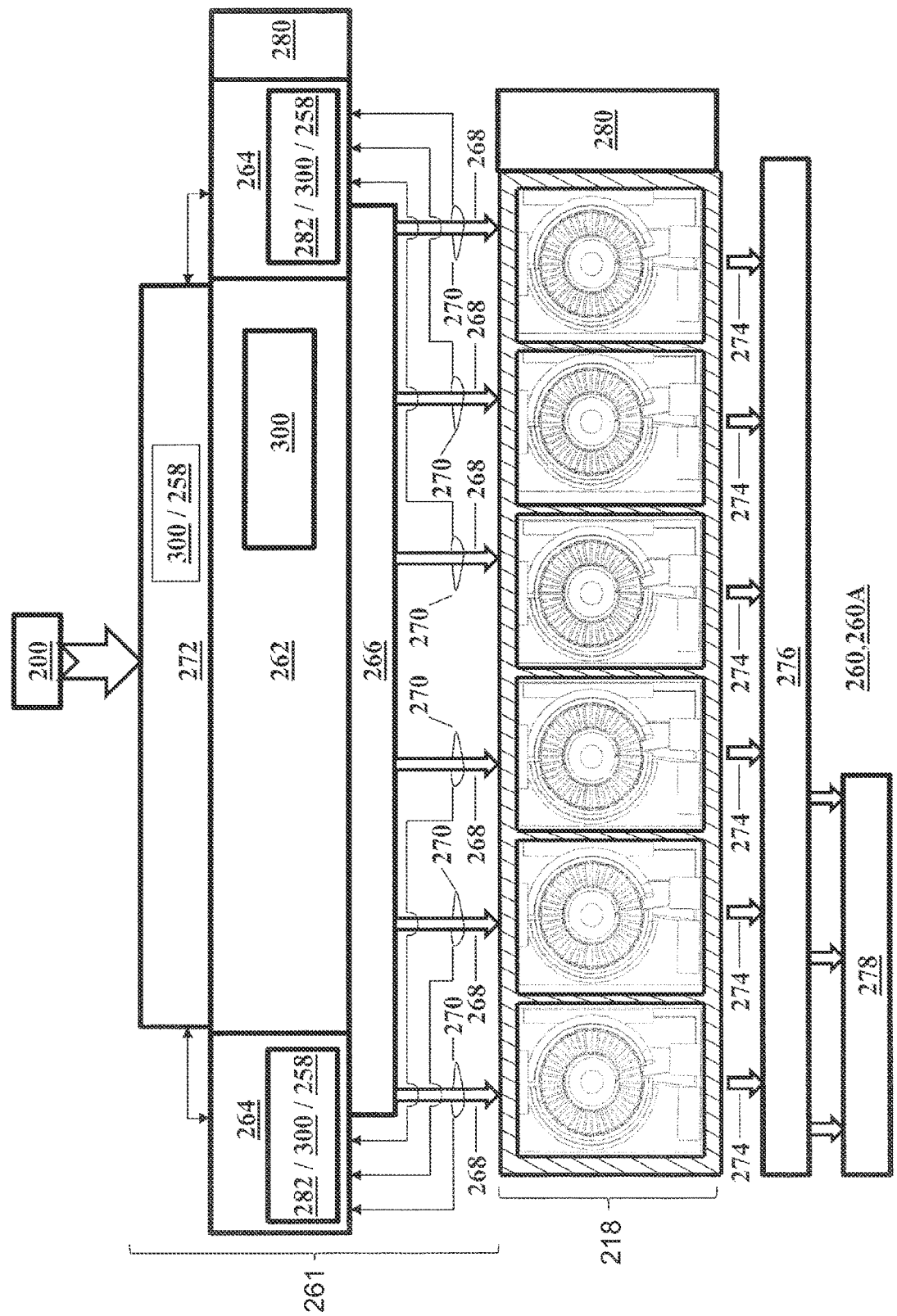

The high efficiency power management stage 200 may be designed to serve all power management configurations: AC-AC, AC-DC, DC-AC, and DC-DC to step up or step down the output voltages. FIG. 3F depicts a high efficiency power management external input stage 260A designed to step-down an AC voltage from a primary electrical source 200 to an AC or DC voltage useful to supplying the server farm 100. A high efficiency power management external input stage 260A comprises an input power block 261, one or more high efficiency power management modules 218, an internal power bus 276, and may optionally comprise an energy storage facility 278 that may further comprise a battery, a flywheel, a resonant high energy storage device, or other means to store electrical energy.

The high efficiency power management external input stage 260A further comprises a current limiter circuit 272 that preferably comprises a fully integrated gyrator 300 described in greater detail below. The current limiter circuit 272 interfaces with one or more power control systems 264 that regulate the flow of electrical currents into a low loss AC-AC transformer stage 262 by monitoring input currents 268 entering one or more high efficiency power management modules 218. When a plurality of high efficiency power management modules 218 are required to effectuate the desired design objectives, the input currents are configured in parallel electrical connection as depicted in FIG. 3F.

The power control systems 264 preferably comprise one or more resonant gate transistors 258 designed to switch power at speeds in excess, preferably at switching speeds that are greater than or equal to 10× the switching speeds of resonant gate transistors 258 incorporated within the one or more high efficiency power management modules 218. The power control systems 264 may also comprise one or more fully integrated gyrators 300.

The one or more resonant gate transistors 258 comprising the power control systems 264 electrically interface with a ladder circuit 282 that rapidly monitors changes to the input currents 268 through current sensors 270. The ladder circuit within power control systems 264 attenuates currents flowing out of the current limiter circuit 272 to the AC-AC transformer stage 262 before they rise to a level that will damage the high efficiency power management modules 218 or electronic equipment housed within the server farm 100. The current limiter circuit 272 comprises one or more resonant gate transistors 258 that are synchronized with the resonant gate transistors 258 functioning within the power control systems and rapidly switches excess power emanating from the primary electrical source 200 to ground when the ladder circuit 282 senses a leading edge of pulse or power spike that exceeds specified limits.

Parallel output currents 274 (AC or DC) from the high efficiency power management modules 218 to an internal power bus 276 that supplies core internal power to the server farm 100 or general facility. The high efficiency power management modules 218 and the input power block 261 may optionally form a thermal interface with a thermoelectric device 280, preferably a thermoelectric device comprising a 3D quantum gas.

The high efficiency power management modules 218 within a high efficiency power management external input stage 260A may be designed to function as step down AC-DC inverters or ideal AC-AC transformers when the primary electrical source 200 draws electrical power from elements of the power grid 201 serving transmission line 208, substation 212, and primary customers 214, collectively referred to hereinafter as any other facility that consumes electrical power 204. The high efficiency power management modules 218 within a high efficiency power management external input stage 260A may be designed to function as a step up AC-DC inverter or ideal AC-AC transformer when the primary electrical source 200 draws electrical power from the secondary customer 216 power lines of the power grid 201.

It is a specific objective of the application that all high efficiency power management modules 218 within a high efficiency power management external input stage 260A are designed to spurious signals that modulate phase and amplitude swings that are passed on to the power grid by switched mode power supplies in DC-AC or AC-DC invertors and DC-DC convertors that operate at non-optimal frequencies that are harmful to human health and is otherwise known as Dirty Electricity. This health problem is resolved by tuning resonant gate transistors 258 within high efficiency power management modules 218 designed to operate as filtering AC-AC transformers, wherein the resonant gate transistors 258 switch power at optimal frequencies that are not harmful to human health and filter Dirty Electricity from AC output voltages.

A preferred embodiment of the application comprises a high efficiency power management external input stage 260A is designed to step-down an AC voltage from a primary electrical source 200 that comprise power grid voltages serving transmission line customers 208, sub-station transmission line customers 212, or primary customers 214 wherein the input power block 261 and the high efficiency power management modules 218 are designed to step-down the output power as an AC or DC voltage.

An additional preferred embodiment of the application comprises a high efficiency power management external input stage 260A designed to step-up an AC voltage from a primary electrical source 200 that comprise power grid 201 voltages that serve secondary customers.

Figure 3G:
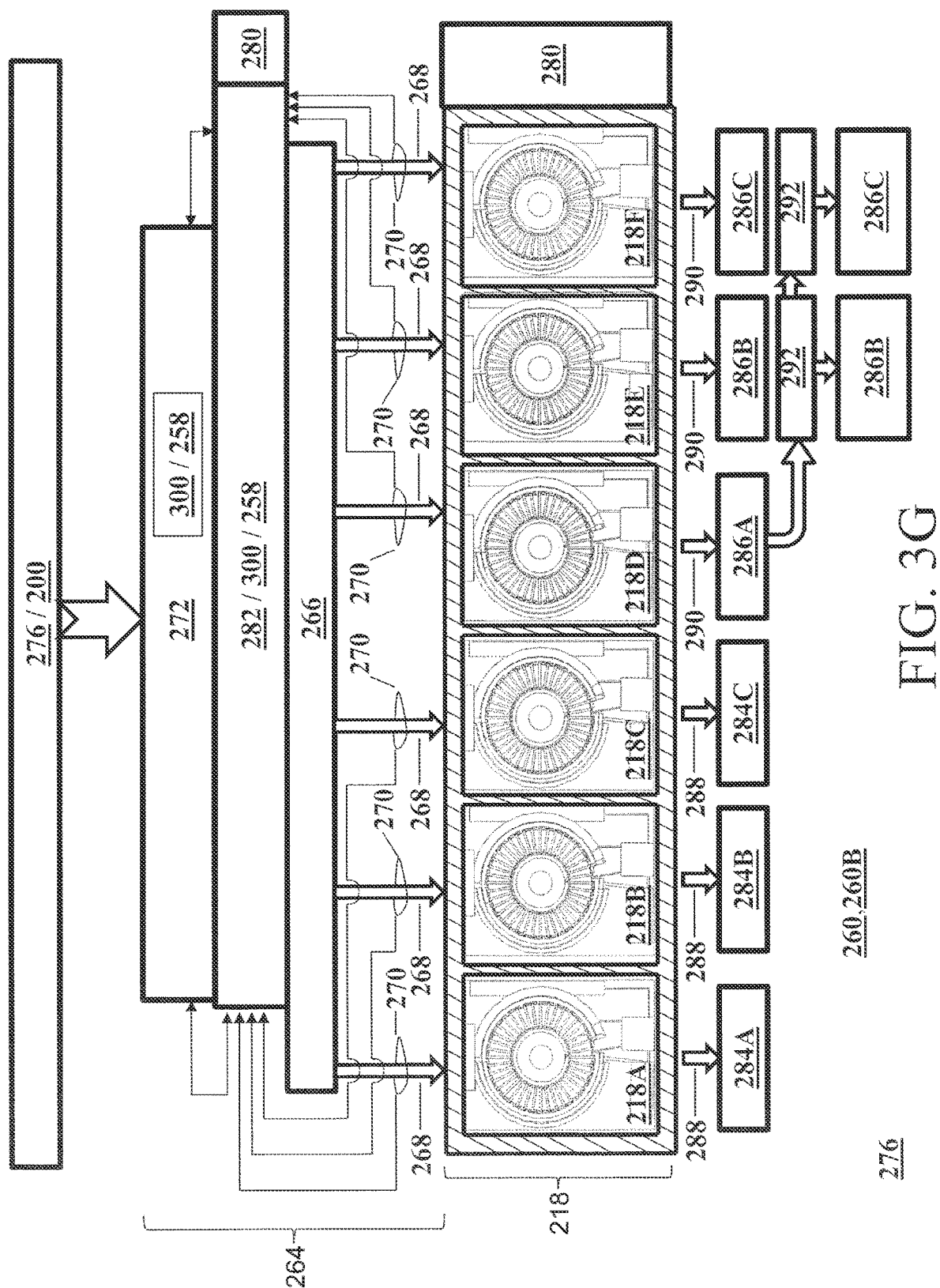
Figure 4A:
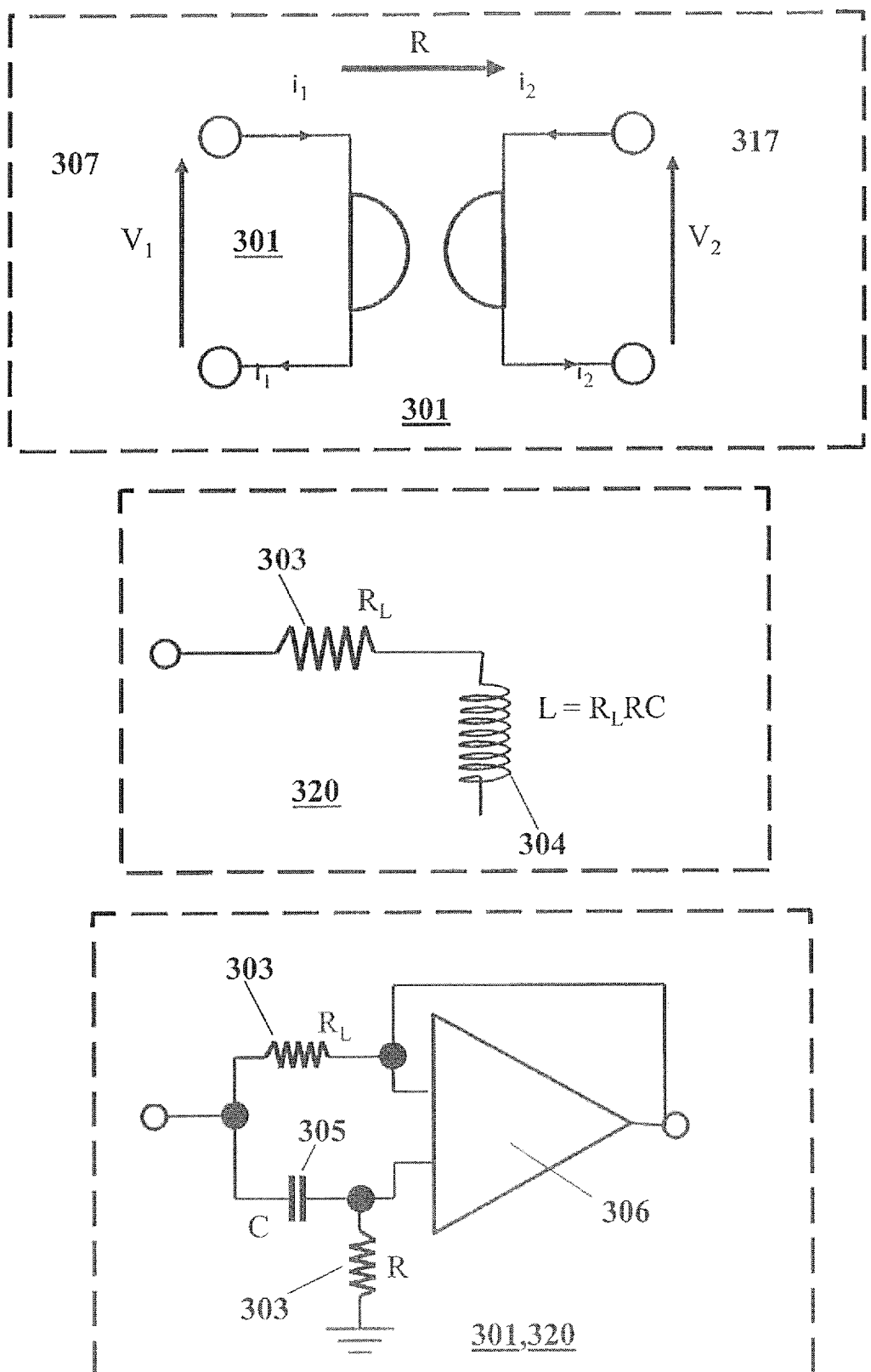
FIGS. 4A,4B,4C,4D,4E,4F,4G,4H,4I illustrate a fully integrated solid state gyrator device.
Figure 4B:
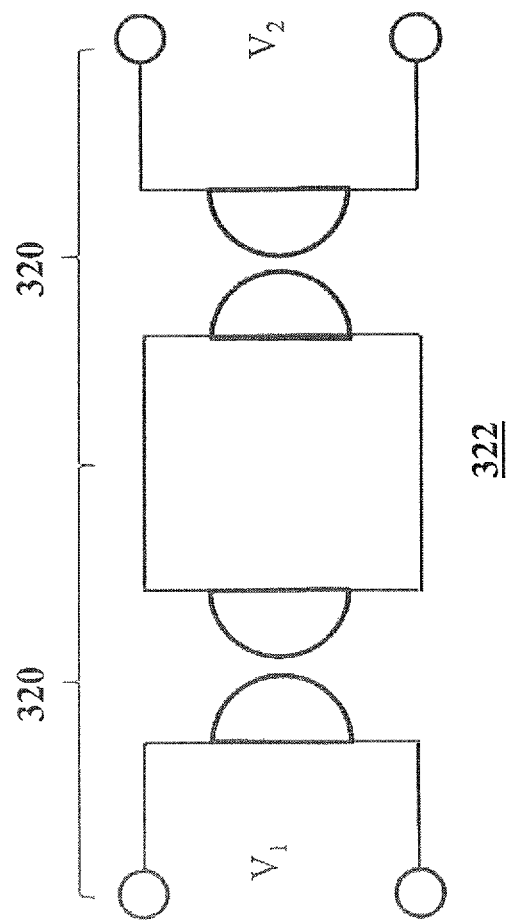
Figure 4C:
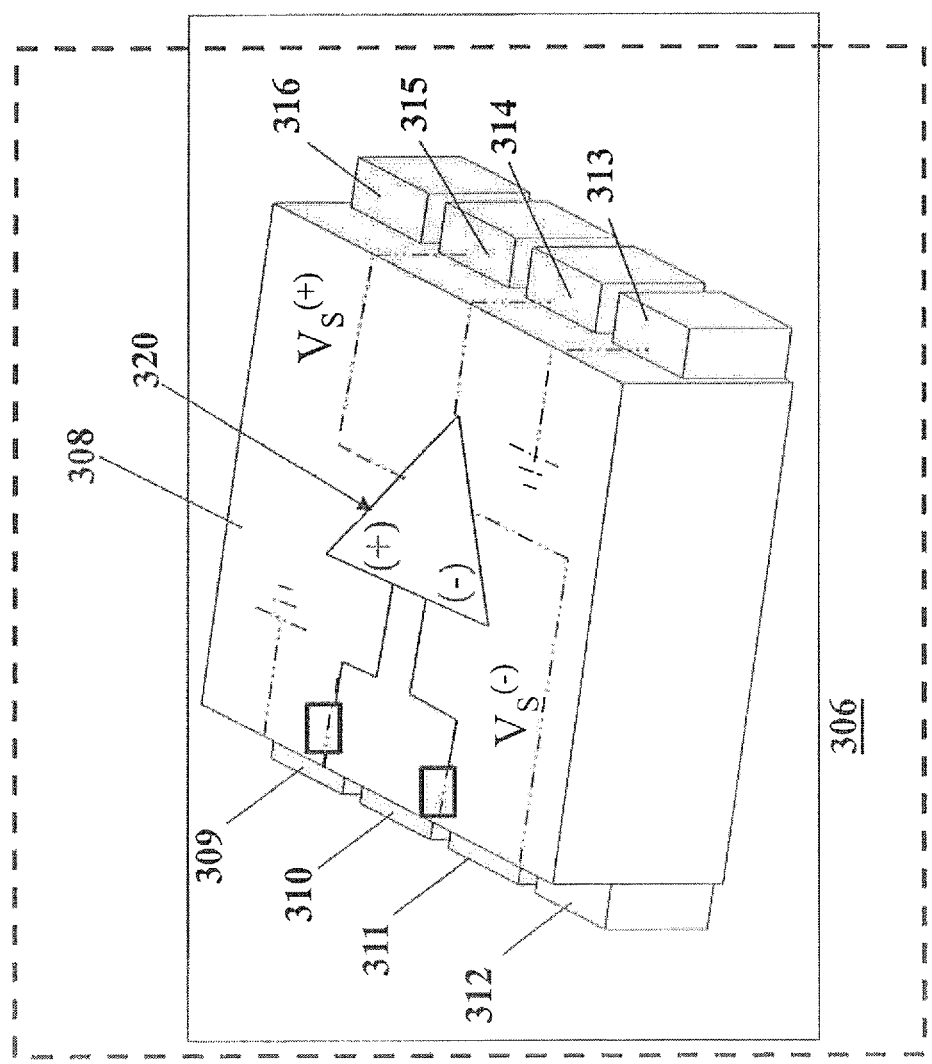
Figure 4D:
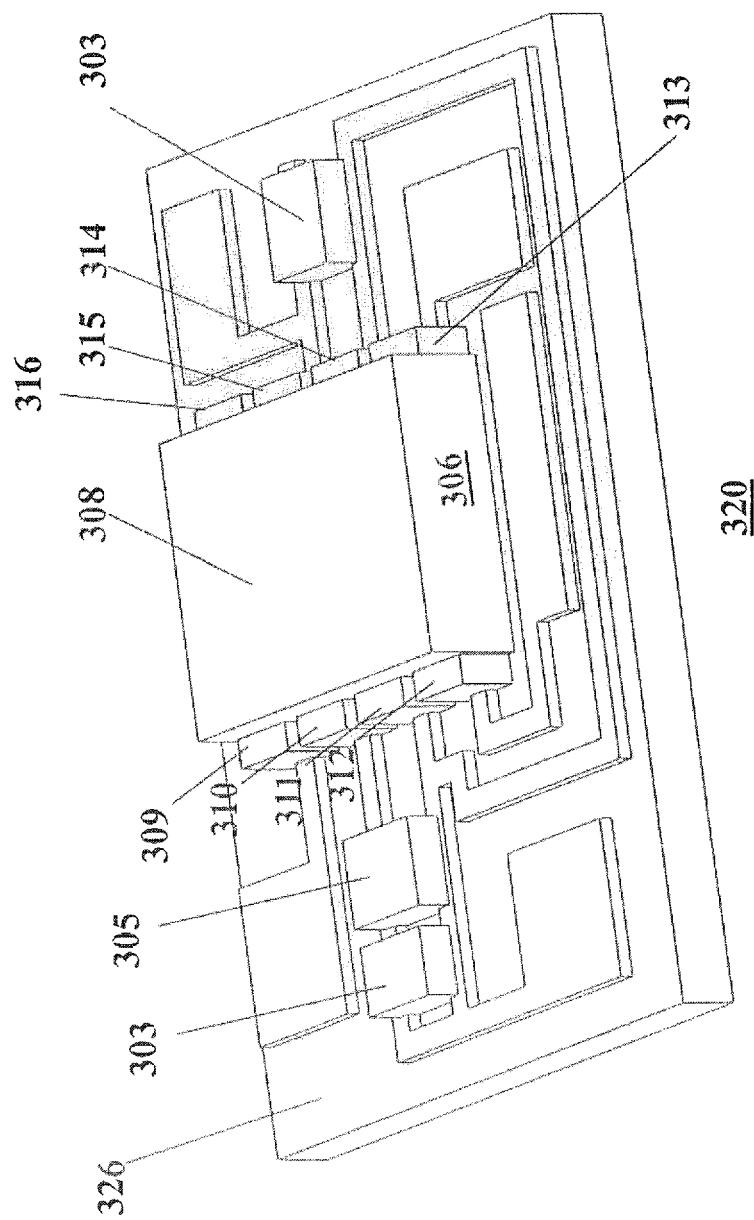
Figure 4E:
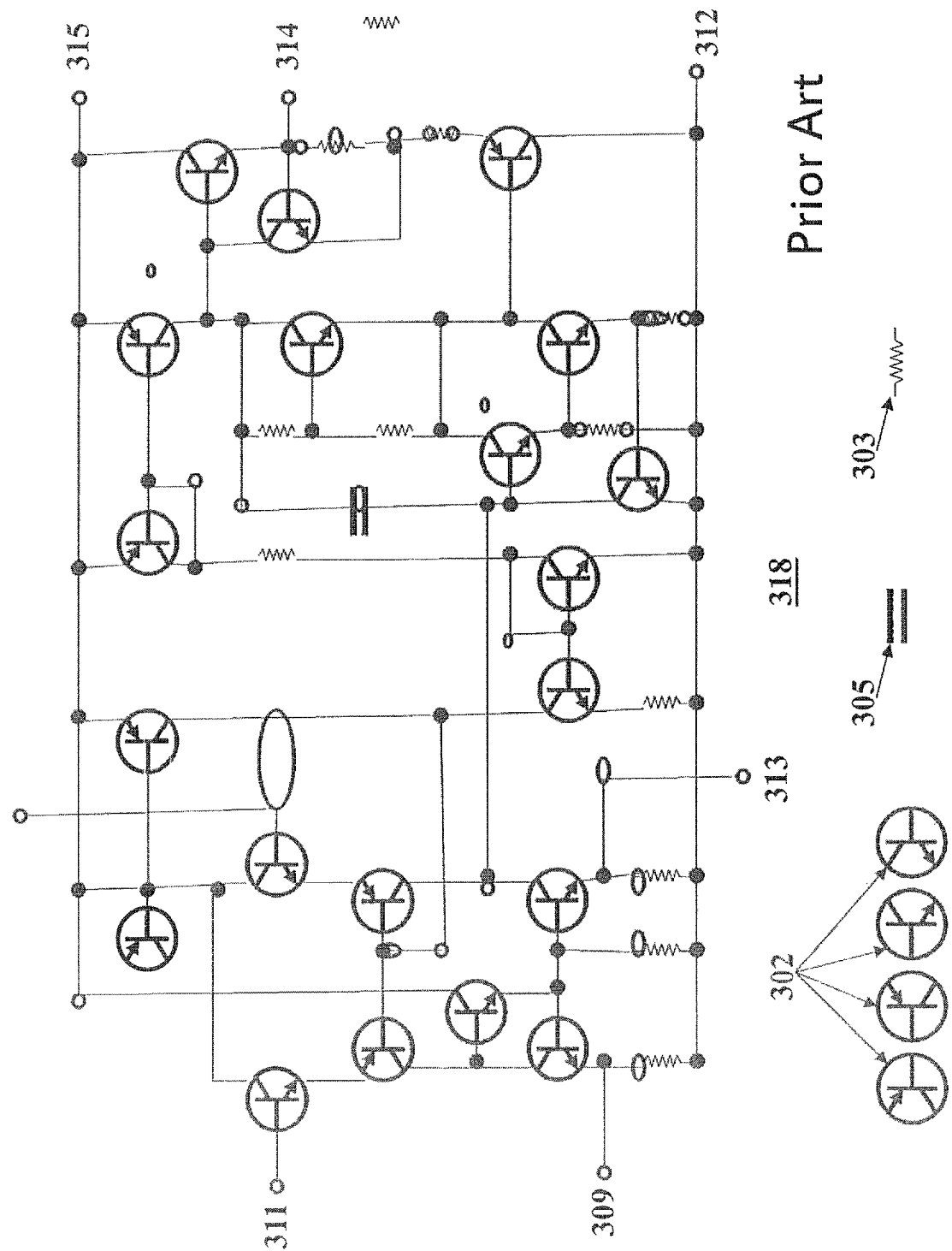
Figure 4F:
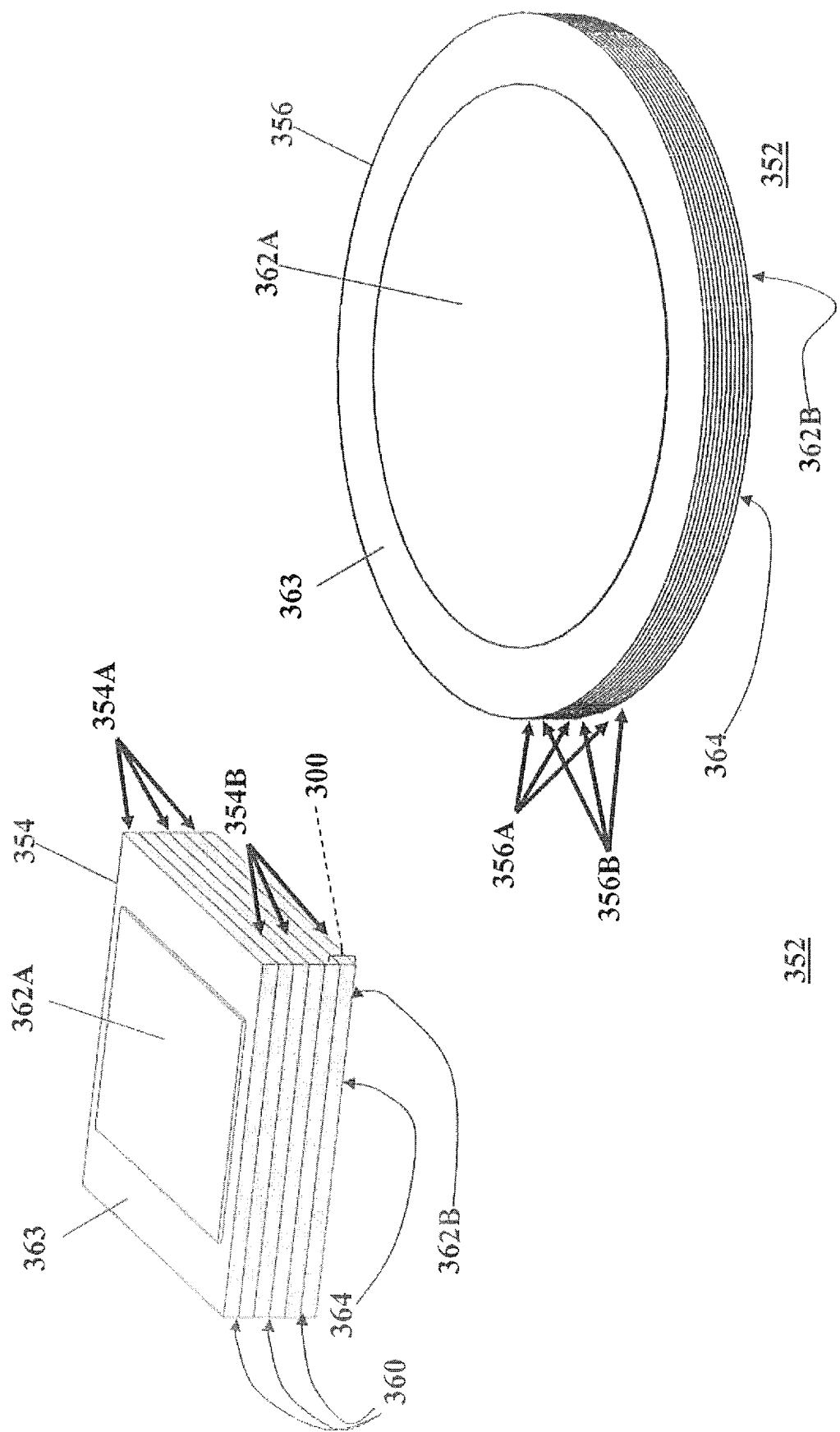
Figure 4G:
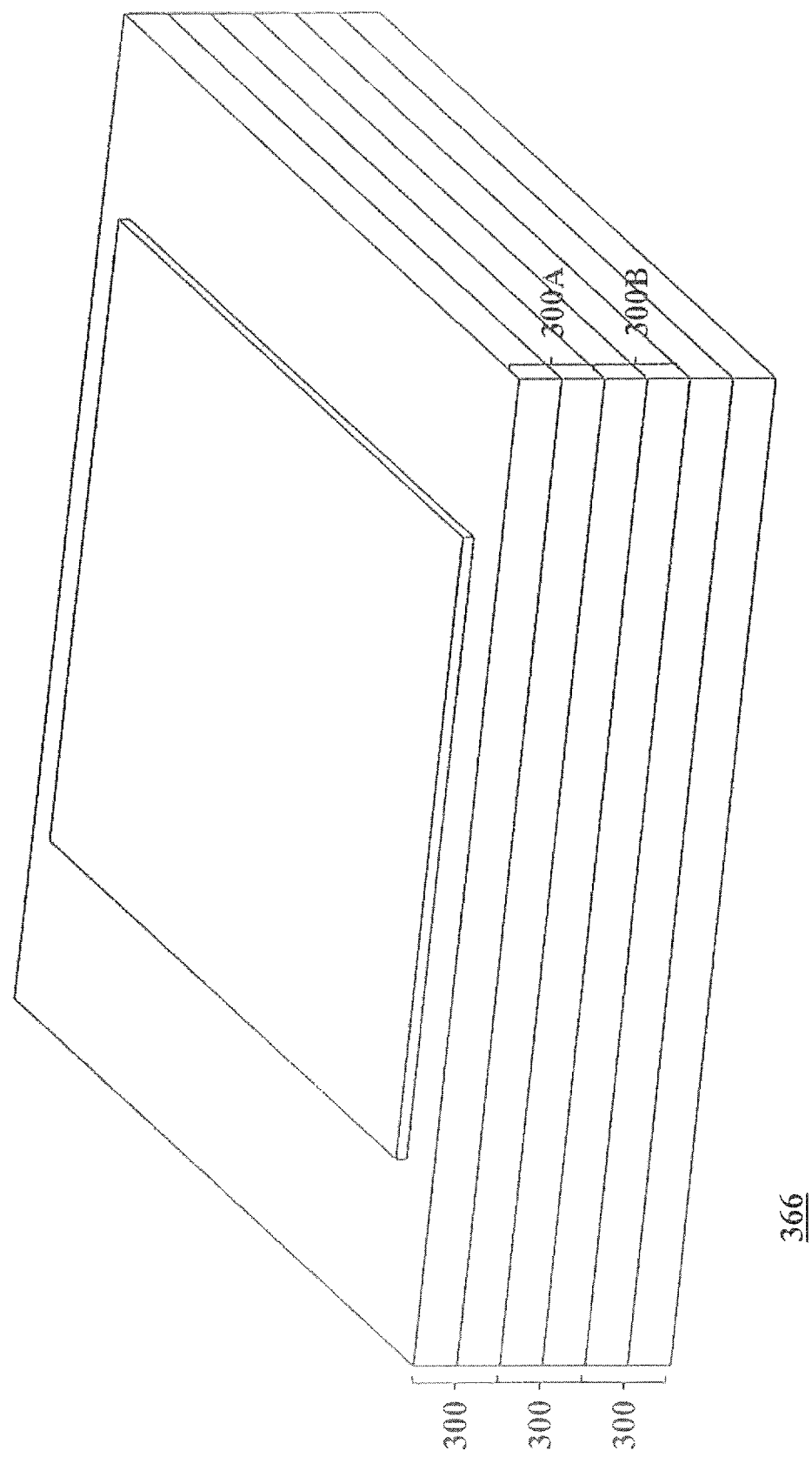
Figure 4H:
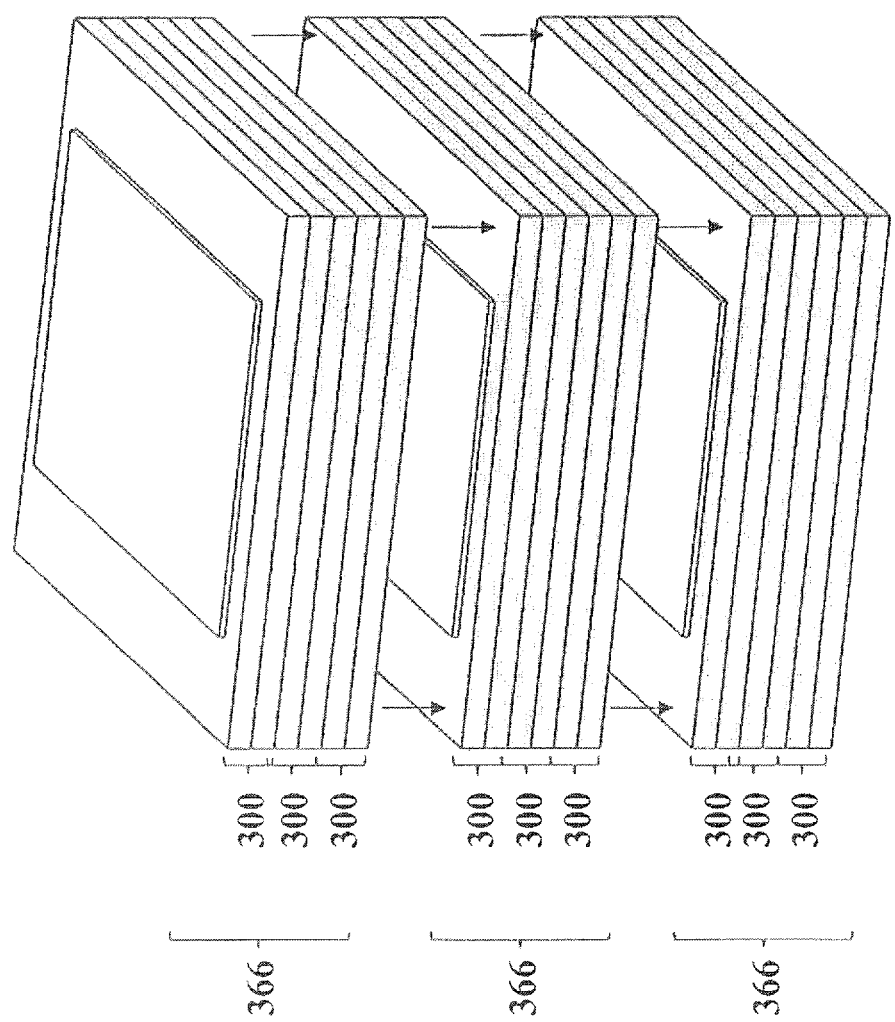
Figure 4I:
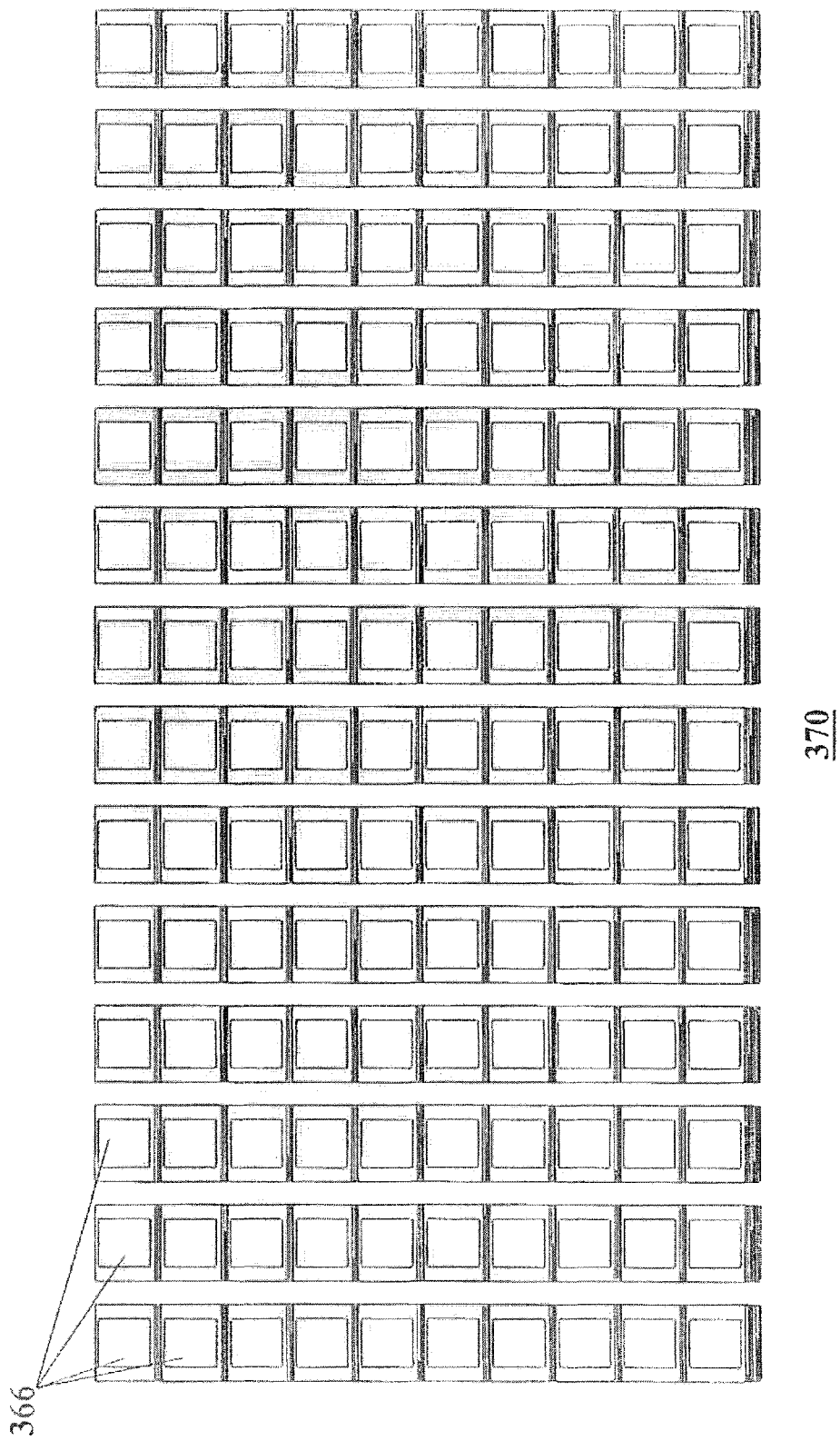

FIG. 3G depicts a high efficiency power management internal input stage 260B designed to step-down a DC voltage drawn from a power bus 276 internal to the server farm 100 or customer facility or a primary electrical source 200 that comprises DC voltage, such as 600 VDC, 800 VDC, or higher other battery voltage. In this instance, DC power 276,200 is input to the power control system 264 of the high efficiency power management internal input state 260B. The power control system 264 comprises a current limiter 272, a resonant gate transistor 258, a fully integrated gyrator 300, and a ladder circuit 282, current sensors 270 that monitor changes in the amplitude of input currents 268. The power control system 264 may optionally comprise a thermoelectric device 280 that preferably is a thermoelectric device 280 that comprises a 3D quantum gas.

In the instance where the high efficiency power management internal input stage 260B is designed to step-down a DC voltage drawn from a power bus 276 internal to the server farm 100 or customer facility, or is supplied power from a primary electrical source 200 that comprises a DC voltage source, the high efficiency power management modules 218 comprise DC to DC converters 218A, 218B, 218C that feed DC power 288 to DC power buses 284A 284B 284C at various voltages 1 VDC 284A, 5 VDC 284B, and 12 VDC 284C or any other DC voltage that has value to the server farm 100 or other facility.

In another instance where the high efficiency power management internal input stage 260B is designed to step-down or step-up a DC voltage drawn from a power bus 276 internal to the server farm 100 or customer facility, or is supplied power from a primary electrical source 200 that comprises a DC voltage source to a desired AC output power at various AC voltages, the high efficiency power management modules 218 comprise DC to AC inverters 218D, 218E, 218F that feed a plurality of AC parallel currents 290 to AC power buses 286A,286B,286C at various voltages 110

VAC 286A, 220 VAC 286B, and 408 VAC 286C or any other AC voltage that has value to the server farm 100 or other facility.

Alternatively, a single AC power bus (any of 286A,286B, 286C, depicting 286A in FIG. 3G) may be used to feed additional low-loss transformers 292 that step up or step down the AC power to the other AC power buses (depicting 286B,286C in FIG. 3G). AC power buses 286A,286B,286C may comprise low-loss hollow waveguide structures.

A specific objective of the invention is a power management system 295 that delivers electrical power drawn from the power grid 201 to a server farm 100 or any other facility that consumes electrical power and uses three (3) high power efficiency power management stages 260A,260B, preferably only uses two (2) high power efficiency power management stages 260A,260B, between the power grid 201 and any internal AC or DC power bus 276,284A,284B, 284C,286A,286B,286C in a server farm 100 or any other facility that consumes electrical power.

An additional specific objective of the application is a power management system 295 that comprises three (3) power management stages 260,260A,260B, preferably only two (2) power management stages 260,260A,260B, to reduce power losses generated delivering power from a primary electrical source 200 to any internal AC or DC power bus 276,284A,284B,284C,2846,286B,286C in a server farm 100 to 10%, preferably 5%, by using power management stages 260 that have power efficiencies greater than or equal to 95%, preferably greater than or equal to 98%.

Reference is now made to FIGS. 4A,4B,4C,4D,4E,4F,4G, 4H,4I to illustrate various embodiments relating to a fully integrated gyrator 300.

The gyrator 301 is a passive, linear, lossless two-port electrical network element 324 that cross couples voltage $V_1$ on port 1 307 to the current $_{/2}$ on port 2 317 or the current $_{/1}$ on port 1 307 to the voltage $V_2$ on port 2 317. Instantaneous currents ($_{/1}$,$_{/2}$) and instantaneous voltages ($V_1$,$V_2$) are related by:

$$V_2 = R_{/1} \quad V_1 = -R_{/2} \qquad (2)$$

where R is the gyration resistance of the gyrator 301. Circuit topology is used to tune the gyration resistance R of a gyrator 301, which can be made to range from 10 s Ω through 100 s of KΩ.

The gyrator 301 is built with active transistors 302, operational amplifiers (op-amps) 306 and feedback through one or more resistors 303, and one or more inductors 304 or capacitors 305. A gyrator 301 inverts the current-voltage characteristics of an electrical current-voltage characteristic of an electrical component or network circuit. With linear elements, a gyrator 301 comprising a capacitor 305 will behave like (simulate) an inductor 304, and when comprising an inductor 304 the gyrator 301 behave like a capacitor 305. Similarly, when the gyrator 302 comprises a series LC network filter, it will perform like a parallel LC network filter, and vice versa. A gyrator 301 that functions as a simulated inductor 320 comprises an op-amp 306, resistor 303, and a capacitor 304.

The simulated inductance and resistance of a gyrator 301 that functions as a simulated inductor 320 are much greater than that of a physical inductor and create inductive responses that range from the micro-Henry (μH) range up to the Mega-Henry (MH) range, whereas physical inductors are limited to tens (10s) of Henrys (10 H). The parasitic series resistances of physical inductors range 100s of micro-Ohms (μΩ) to through to the low kilo-Ohms (KΩ). This wider dynamic range theoretically enables gyrators 301 that function as lossless ideal transformers 322 by cascading two gyrators 301 that function as simulated inductors 320 that creates voltage-to-voltage cross-coupling identical to an ideal transformer 322. Gyrators 301 do not store any energy and cannot be used as a substitute in switched mode high voltage power management systems 295 that require an energy storage inductor coil or flyback transformer coils 220.

Existing gyrators 301 operate well below the theoretical potential of these ideal transformers 322. Key performance limitations for contemporary gyrators 301 are limitations to the gain bandwidth of transistor elements' 302 in the op-amp circuit 318, excess heat generated at higher switching speeds, and the tolerable power levels (voltage drops) that can be sustained by the transistor gate. Therefore, a desirable aspect of the present application is a fully integrated gyrator 300 that functions as an ideal, lossless transformer at high power loads and with higher bandwidths. Methods and embodiments that increase transistor transition frequencies $f_T$ (current gain bandwidth products) and improve power efficiencies are desirable to reaching ideal transformer performance using fully integrated gyrators 300.

Active transistors used in prior art op-amps 318 comprise standard field effect transistors (FETs) or junction field effect transistors (JFETs). These transistors function effectively as a capacitor valve with a high frequency cut-off that restricts higher bandwidth As noted above, the resonant gate transistor 258 instructed by de Rochemont '489/'532 embeds inductor elements (and other passive circuit elements) within the transistor gate to cause it to resonant and switch large currents at frequencies far higher than those achievable with the ubiquitous capacitor topology prevalent throughout all the prior art.

The elongated transistor gate width instructed available through resonant gate transistor 258 collect very large capacitance and are capable of switching extremely large gain-enhancing currents at low current density and near negligible On-Resistance to further enhance gain beyond transistor transition frequencies $f_T$ achievable with simple capacitor filtering topologies. The introduction of additional passive elements within the transistor gate are used to transform the gate's frequency bandwidth from a simple capacitive filter with a high frequency cut-off to that of a network filter that adds wider dynamic range to improve gain-bandwidth product over a range of higher frequencies than is possible with a simple FET or JFET. Furthermore, the ability of the resonant gate transistor to embed highly resistive elements between the gate and source electrodes permits the resonant gate transistor 258 to be which switched using large voltage drops, those removing the major constraints of modern op-amps.

It is therefore a specific embodiment of the invention to substitute at least one transistor element 302, preferably all transistor elements within an op-amp circuit 318 with resonant gate transistor 258.

A gyrator 301 constructed under the prior all consists of a packaged op-amp 306 that has 8 pins (309, 310, 311, 312, 313, 314, 315, 316) to interface the op-amp circuitry 318 with other circuit elements 303, 304 or 305 mounted on a printed circuit board 326.

de Rochemont '234 instructs that commodity materials used to make surface mounted passive components 303,304, 305 and printed circuit boards 326 have a slow polarization response that distorts frequency components and limit readable signals at frequencies above 2.5 GHz.

de Rochemont '234 further instructs means to fabricate high-speed chip stacks 2 and hybrid modules 1 that comprise passive circuit elements, further comprising high energy density electroceramic members 12 that can be integrated at the wafer scale to critical performance tolerances.

de Rochemont '234 additionally instructs that capacitors 305 laminated at the wafer scale with high energy density electroceramic members 12 having a uniform microstructure wherein all grains have uniform chemistry and uniform grain size less than 50 nm in diameter polarize and depolarize at femto-second time scales and thus allow transistor clock speeds to be shifted from GHz frequencies into the THz domain.

de Rochemont '234 further instructs means to embed passive circuitry at or very near to the vias in high-speed chip semiconductor stacks to minimize stub lengths that impose an additional limitation on high speed circuitry.

It is therefore a preferred embodiment of the application claims a folly integrated gyrator 300, preferably a loss-less transformer 350 though any and all gyrator embodiments are similarly claimed, that comprises a high speed stack of semiconductors 352, that may be a stacked assembly of semiconductor chips 354A or stacked assembly of semiconductor wafers 356B, wherein one or more semiconductor chip 354A or wafer 356A comprises transistor elements 302 needed to form an operational amplifier circuit 318 and at least one of said transistor elements 302, preferably all of said transistor elements 302, is a resonant gate transistor 258.

An additional preferred embodiment of the application claims a fully integrated gyrator 300, preferably a loss-less transformer 322 though any and all gyrator 300 embodiments are similarly claimed, that comprises a high speed stack of semiconductors 352, that may be stacked semiconductor chip 354 or stacked semiconductor wafer embodiments 356, wherein one or more semiconductor interposer chips 354B or wafers 356B comprises all passive circuit elements 303,304,305 needed to form an operational amplifier circuit 318 and those additional passive circuit elements 303,304,305 that are needed to form a fully integrated gyrator circuit 300 are integrated as laminated components within the semiconductor interposer chip 354B or wafer 356B.

Yet another embodiment claims a high speed stack of semiconductors 352, comprising one or more gyro tors 300 within the high speed stack of semiconductors 352 wherein vias electrically interface passive circuit elements 303,304, 305 laminated on and integrated within a semiconductor interposer chip 354B or wafer 356B through a bonded internal major surface interface 360 that mates with transistor elements 302 needed to form an operational amplifier circuit 318, wherein and at least one of said transistor elements 302, preferably all of said transistor elements 302, is a resonant gate transistor 258, in the semiconductor chip 354A or semiconductor wafer 356A.

Another embodiment claims a fully integrated gyrator 300 comprising a high speed stack of semiconductors 352 wherein the input/output electrodes 362A are located on one major exterior surface 363 of the stack of semiconductors 325A and the output/input electrode 362B of the stack of semiconductors 325 opposing major surface 364.

Yet another embodiment claims a cascading stack 366 of fully integrated gyrators 300, wherein the output electrode 362B on the major surface of the first gyrator 300A is bonded to the input electrode 362A on the major surface of the second gyrator 300B.

Another embodiment claims a cascading stack 366 of fully integrated gyrators 300 that further comprises a plurality of cascading stacks 366 of fully integrated gyrators 300.

Yet another embodiment claims a cascading stack 366 of fully integrated gyrators 300 that operates as a loss-less transformer 322.

Another embodiment claims a fully integrated gyrator 300 that inverts a network filter 320.

Yet another embodiment claims a cascading stack 366 that comprises one or more fully integrated gyrators 300 that operate in tandem as transformers 322 and network filters 320 and together form a complex circuit.

Yet another embodiment claims a fully integrated gyrator 300 wherein the passive circuit elements 303,304,305 comprise high energy density electroceramic members 12 that satisfy critical performance tolerances.

Another embodiment claims a fully integrated gyrator 300 wherein a resonant gate transistor 258 comprises a high resistivity resistor element, imparting resistance greater than 1 KΩ, preferably greater than 1MΩ, between the gate and source electrodes in high power switching applications.

Yet another embodiment claims a fully integrated gyrator 300 wherein a resonant gate transistor 258 comprises a plurality passive elements 303,304,305 integrated within the gate electrode to induce resonance over a wide frequency band or at particular frequency bands that optimize gain-bandwidth of the resonant gate transistor 258 for the function of the fully integrated gyrator 300 or cascading stack 366 of folly integrated gyrators 300.

Another embodiment claims a fully integrated gyrator 300 wherein the laminated passive circuit elements 303,304,305 that are laminated on and integrated within the semiconductor interposer chip 354B or wafer 356B are located in close or immediate proximity to a via.

An ideal loss-less transformer that, comprises a parallel array 370 of cascading stacks 366 of folly integrated gyrators 300 configured in parallel.

Figure 5:
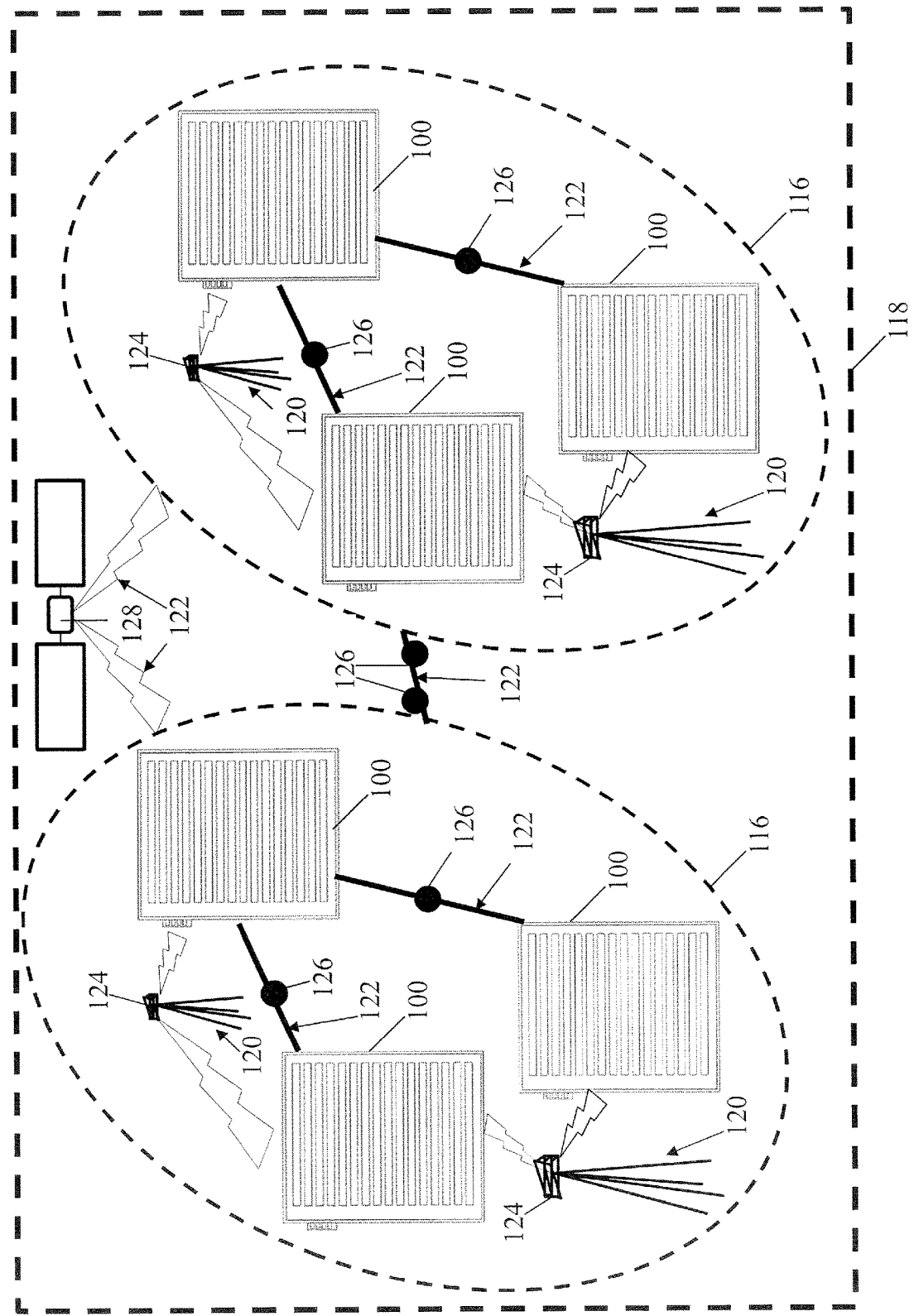
FIG. 5 depicts a regional network or global network comprising server farms that operate at maximal computational speeds with minimal power consumption, as well as the use of high speed optical, wireless, or satellite transceivers, comprising hybrid computing modules, high-speed chip stacks, fully integrated solid state gyrators, and power management devices at nodes within the regional or global network.

Reference is now made to FIGS. 5A,5B to illustrate a regional server farm network 400 or a global network 402 comprising the server farms 100. The regional server farm network 400 comprises a plurality of server farms 100 in digital or analog communication with each other through wireless transmission links 404 or fiber optic transmission lines 406, or through a combination of wireless transmission links 404 and fiber optic transmission lines 406. A preferred embodiment of the regional server farm network 400 comprises microelectronic hardware functioning as routing and relay systems at wireless network nodes 408 and/or fiber optic network nodes 410 that comprises a hybrid computing module 1 and high speed semiconductor chip stacks 2 for all tasks critical to accelerating transmission speeds between the server farms in the regional network.

The higher gain-bandwidth available through the resonant gate transistor as discussed above in power switching also has utility in improving telecommunications. Therefore, a specific embodiment of the application claims telecommunications network nodes 414 (wireless 408, satellite 410, and optical 412) wherein the telecommunications hardware comprises a resonant gate transistor 258, and signal modulation devices that further comprise a high speed chip stack and capacitive passive elements 10.

As referenced above, commodity materials used in printed circuit boards and discrete passive circuit elements distort higher frequency signal pulses need to shape the high speed digital pulse. As instructed in de Rochemont & Kovacs '814, electroceramic dielectric members 12 having nanoscale microstructure maintain their precise performance stable with varying temperatures and generate higher signal integrity, which improves telecommunications bandwidths at a telecommunications network node 414.

de Rochemont '234 instructs that electroceramic members 12 having nanoscale micros tincture enable broader signaling bandwidths because orbital deformation is the only charge displacement mechanism contributing a polarization response from these materials and, thus, moves in phase with modulating signals down to femto-second ($10^{-15}$ sec) time scales. Whereas, commodity materials used in prior art constructions distort signal operating above 2.5 GHz-3.4 GHz.

Therefore, an additional embodiment of the application claims microelectronic hardware and signal modulation systems at telecommunications network nodes that compromise electroceramic members that comprise capacitive dielectric material having nanoscale microstructure.

Improved power efficiency is another desirable element of the application. Therefore, telecommunications networks wherein the network nodes that comprise hybrid computing systems that further comprise a FORTH engine, resistive element X-(Cross-Point memory and use no cache memory are clear benefits of the application.

Another benefit of the application is reduced power management loss. $V_{DD}$ modulators are often used to reduce DC power losses when modulating AC signal envelopes, but suffer the same higher frequency distortions caused by commodity materials. Therefore, a desired benefit is a telecommunication comprises a $V_{DD}$ modulator that further comprises a resonant gate transistor 258, toroidal inductor and transformer coils 208, and electroceramic dielectric members 12 having nanoscale microstructure to minimize phase distortions.

Additional benefits include power management systems comprising fully integrated gyrators functioning as lossless transformers.

The global server farm network 402 comprises a plurality of regional server farm networks 400 in digital communication with each other through wireless transmission links 404 that will most often comprise satellite wireless links 412, or fiber optic transmission lines 406, which most often will be transoceanic cables, or through a combination of wireless transmission links 404 and fiber optic transmission lines 406. A preferred embodiment of the global server farm network 402 comprises microelectronic hardware functioning as routing and relay systems at wireless network nodes 408 and/or fiber optic network nodes 410 that comprises a hybrid computing module 1 and high speed semiconductor chip stacks 2 for all tasks critical to accelerating transmission speeds between the server farms in the regional network.

What is claimed is:

1. A server farm comprising a server, wherein the server or servers comprise:
   at least one hybrid computing module operating at a system clock speed that optimally matches an intrinsic clock speed of a semiconductor die embedded within a high speed semiconductor chip stack or mounted upon a semiconductor carrier; and
   one or more high-speed semiconductor chip stacks bonded to the surface of a semiconductor carrier in which at least one passive component element maintains critical performance tolerances, and has a polarization response time determined solely by orbital deformations and operates in phase, thus does not distort, any of an applied signal components forming a high-speed digital pulse operating at clock speeds up to and into a terahertz (THz) frequency domain.

2. A server farm as in claim 1, wherein the hybrid computing module within a server or plurality of servers comprises a power management device that further comprises a resonant gate transistor.

3. The server farm of claim 2, wherein the hybrid computing module is configured for Minimal Instruction Set Computing by means of a chip that comprises a FORTH engine mounted on a semiconductor carrier or embedded within a high speed chip stack.

4. The server farm of claim 2, wherein the hybrid computing module configured for Minimal Instruction Set Computing utilizes a computing language other than FORTH, but the processor chip that enables the engine to adopt a Stack Machine Architecture has features similar to a FORTH engine including:
   the ability to access multiple memory spaces simultaneously in a single microprocessor clock cycle; and,
   that utilizes a minimal number of instruction sets through the use of separate buses to access memory holding a data stack, a return stack, and a program memory, among other useful program utilities.

* * * * *